(12) United States Patent
Takahashi et al.

(10) Patent No.: US 7,015,119 B2
(45) Date of Patent: Mar. 21, 2006

(54) FABRICATION METHOD OF SEMICONDUCTOR INTEGRATED CIRCUIT DEVICE

(75) Inventors: Osamu Takahashi, Eniwa (JP); Kunio Ogasawara, Chitose (JP)

(73) Assignees: Renesas Technology Corp., Tokyo (JP); Hitachi Hokkai Semiconductor, Ltd., Hokkaido (JP)

(*) Notice: Subject to any disclaimer, the term of this patent is extended or adjusted under 35 U.S.C. 154(b) by 0 days.

(21) Appl. No.: 10/996,464

(22) Filed: Nov. 26, 2004

(65) Prior Publication Data

US 2005/0087493 A1     Apr. 28, 2005

Related U.S. Application Data

(60) Continuation of application No. 10/364,506, filed on Feb. 12, 2003, now abandoned, which is a division of application No. 10/266,769, filed on Oct. 9, 2002, now abandoned.

(30) Foreign Application Priority Data

Oct. 31, 2001   (JP) .......................... 2001-335371

(51) Int. Cl.
*H01L 21/322* (2006.01)

(52) U.S. Cl. .................... 438/477; 134/2; 134/95.2

(58) Field of Classification Search ............. 210/636, 210/638; 134/1.3, 2, 95.2, 902; 438/471–477, 438/747, 906
See application file for complete search history.

(56) References Cited

U.S. PATENT DOCUMENTS

| | | | |
|---|---|---|---|
| 4,610,790 A | 9/1986 | Reti et al. | |
| 4,787,980 A | 11/1988 | Ackermann et al. | |
| 4,975,199 A | 12/1990 | Woster et al. | |
| 5,242,468 A | 9/1993 | Clark et al. | |
| 5,282,965 A | 2/1994 | Urairi et al. | |
| 5,351,523 A | 10/1994 | Blackford et al. | |
| 5,445,706 A * | 8/1995 | Okuno et al. | 438/691 |
| 5,938,857 A * | 8/1999 | Fujiwara et al. | 134/2 |
| 6,138,690 A * | 10/2000 | Nakatani | 134/1.3 |
| 6,494,223 B1 * | 12/2002 | Ohmi et al. | 134/201 |

FOREIGN PATENT DOCUMENTS

| | | |
|---|---|---|
| JP | 4-78483 | 3/1992 |
| JP | 8-89954 | 4/1996 |
| JP | 9-10713 | 1/1997 |
| JP | 10-216721 | 8/1998 |
| JP | 2000-228387 | 8/2000 |

* cited by examiner

*Primary Examiner*—David Nelms
*Assistant Examiner*—Calvin Lee
(74) *Attorney, Agent, or Firm*—Antonelli, Terry, Stout and Kraus, LLP.

(57) ABSTRACT

A method of fabrication of a semiconductor integrated circuit device, calls for disposing, in an ultrapure water preparing system, UF equipment having therein a UF module which has been manufactured by disposing, in a body thereof, a plurality of capillary hollow fiber membranes composed of a polysulfone membrane or polyimide membrane, bonding the plurality of hollow fiber membranes at end portions thereof by hot welding, and by this hot welding, simultaneously adhering the hollow fiber membranes to the body. Upon preparation of ultrapure water to be used for the fabrication of the semiconductor integrated circuit device, it is possible to prevent run-off of ionized amine into the ultrapure water.

28 Claims, 33 Drawing Sheets

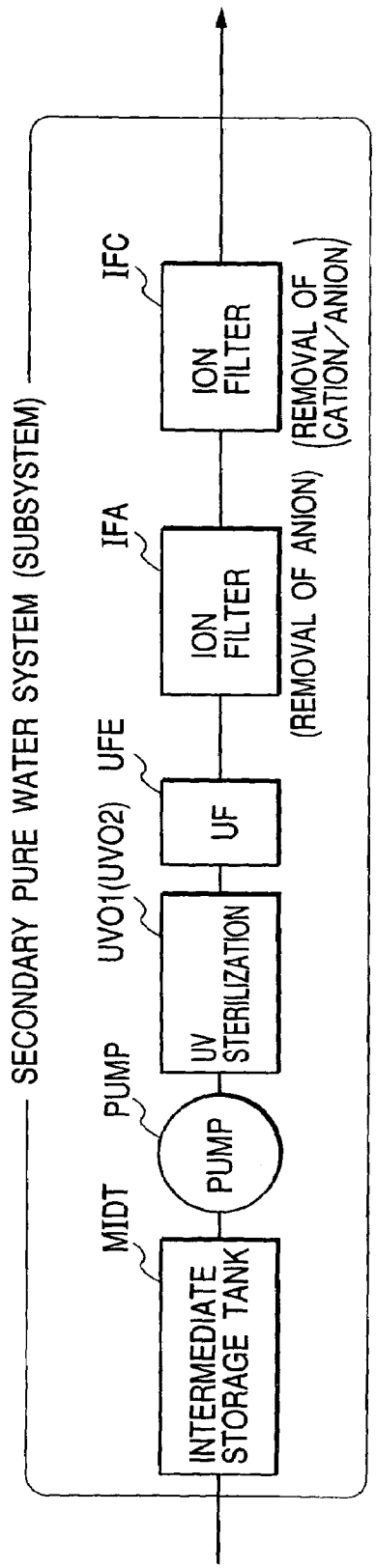
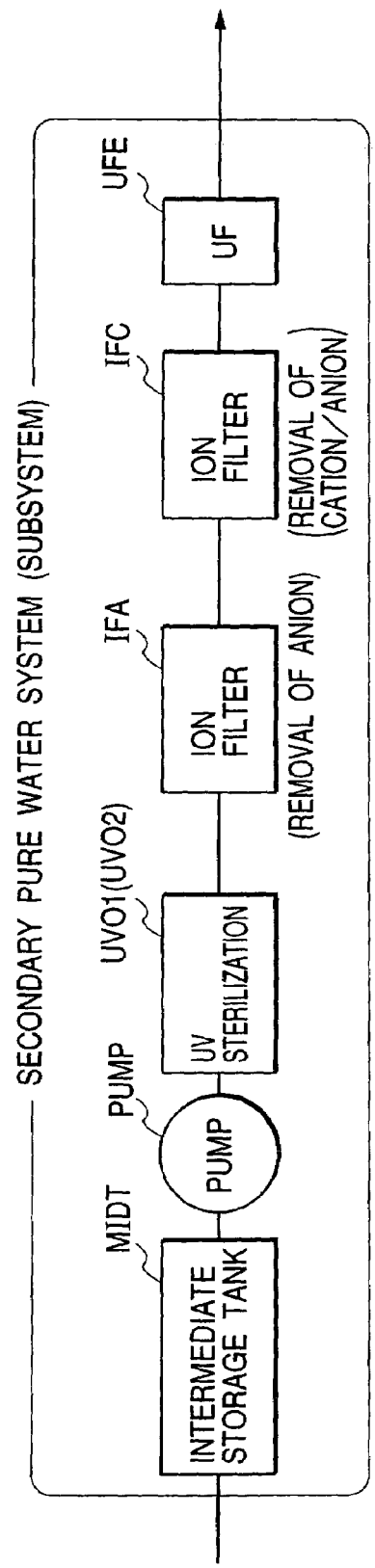

FIG. 27

BREAKDOWN VOLTAGE AFTER REPLACEMENT WITH A NEW ANION REMOVING FILTER (ION EXCHANGE RESIN TYPE) AND A NEW MIXED ION REMOVING FILTER (ION EXCHANGE RESIN TYPE)

UNIT [V]

| | | | | | | | | | | | |
|---|---|---|---|---|---|---|---|---|---|---|---|
| | | | | 8.4 | 8.4 | 8.4 | 8.4 | 8.6 | 8.6 | 8.6 | |
| | | | (7.8) | (7.6) | (7.8) | (7.8) | (7.4) | (7.4) | (7.4) | (7.6) | |
| | | (7.2) | (7.4) | (7.8) | (7.4) | (7.8) | 8.0 | 8.2 | 8.4 | 8.2 | |
| | 8.4 | 8.4 | 8.4 | 8.4 | 8.4 | 8.4 | 8.4 | 8.4 | 8.6 | 8.6 | 8.6 |
| | 8.4 | 8.4 | 8.4 | 8.4 | 8.4 | 8.4 | 8.4 | 8.4 | 8.6 | 8.6 | 8.6 |
| | 8.4 | 8.4 | 8.4 | 8.4 | 8.4 | 8.4 | 8.4 | 8.4 | 8.6 | 8.6 | 8.6 |
| | 8.4 | 8.4 | 8.4 | 8.4 | 8.4 | 8.4 | 8.4 | 8.4 | 8.6 | 8.6 | 8.6 |
| | 8.4 | 8.4 | 8.4 | 8.4 | 8.4 | 8.4 | 8.4 | 8.4 | 8.6 | 8.6 | 8.6 |
| | 8.4 | 8.4 | 8.4 | 8.4 | 8.6 | 8.6 | 8.6 | 8.6 | | | |
| | 8.4 | 8.4 | 8.4 | 8.4 | 8.6 | 8.6 | 8.6 | | | | |
| 8.4 | 8.4 | 8.4 | 8.4 | 8.6 | 8.6 | 8.6 | | | | | |

FIG. 28

BREAKDOWN VOLTAGE WHEN ReF, THAT IS, UF WHICH HAS BEEN USED LONG, IS USED

UNIT [V]

| | | | | | | | | | | | | | |
|---|---|---|---|---|---|---|---|---|---|---|---|---|---|
| | | | | | | 8.4 | 8.4 | 8.4 | 8.4 | 8.4 | 8.4 | | |
| | | | | | 8.4 | 8.4 | 8.4 | 8.4 | 8.4 | 8.4 | 8.4 | | |
| | | | | 8.4 | 8.4 | 8.4 | 8.4 | 8.4 | 8.4 | 8.4 | 8.4 | | |
| | | | 8.4 | 8.4 | 8.4 | 8.4 | 8.4 | 8.4 | 8.4 | 8.4 | 8.4 | 8.4 | |
| | | | 8.4 | 8.4 | 8.4 | 8.4 | 8.4 | 8.4 | 8.6 | 8.6 | 8.4 | 8.4 | |
| | | | 8.4 | 8.4 | 8.4 | 8.4 | 8.4 | 8.4 | 8.6 | 8.4 | 8.4 | 8.4 | |
| | | | 8.4 | 8.4 | 8.4 | 8.4 | 8.4 | 8.4 | 8.6 | 8.6 | 8.4 | 8.4 | |
| | | | 8.4 | 8.4 | 8.4 | 8.4 | 8.4 | 8.4 | 8.4 | 8.4 | 8.4 | 8.4 | |
| | | | 8.4 | 8.4 | 8.4 | 8.4 | 8.4 | 8.4 | 8.4 | 8.4 | 8.4 | | |
| | | 8.4 | 8.4 | 8.4 | 8.4 | 8.4 | 8.4 | 8.4 | 8.4 | | | | |
| | 8.4 | 8.4 | 8.4 | 8.4 | 8.4 | 8.4 | 8.6 | | | | | | |
| 8.4 | 8.4 | 8.4 | 8.4 | 8.6 | 8.6 | | | | | | | | |

FIG. 29

BREAKDOWN VOLTAGE WHEN NEW UF AND MIXED ION REMOVING FILTER (ION EXCHANGE RESIN TYPE) ARE USED IN COMBINATION

UNIT [V]

| | | | | | | | | | | | | | |
|---|---|---|---|---|---|---|---|---|---|---|---|---|---|
| | | | | | | | 8.4 | 8.4 | 8.4 | 8.4 | 8.4 | 8.4 | |
| | | | | | | 8.4 | 8.4 | 8.4 | 8.4 | 8.4 | 8.4 | 8.4 | |
| | | | | | 8.4 | 8.4 | 8.4 | 8.4 | 8.4 | 8.4 | 8.4 | 8.4 | |
| | | | 8.4 | 8.4 | 8.4 | 8.4 | 8.4 | 8.4 | 8.4 | 8.4 | 8.4 | 8.4 | 8.4 |
| | | | 8.4 | 8.4 | 8.4 | 8.4 | 8.4 | 8.4 | 8.4 | 8.4 | 8.4 | 8.4 | 8.4 |
| | | | 8.4 | 8.4 | 8.4 | 8.4 | 8.4 | 8.4 | 8.4 | 8.4 | 8.4 | 8.4 | 8.4 |
| | | | 8.4 | 8.4 | 8.4 | 8.4 | 8.4 | 8.4 | 8.4 | 8.4 | 8.4 | 8.4 | 8.4 |
| | | | 8.4 | 8.4 | 8.4 | 8.4 | 8.4 | 8.4 | 8.4 | 8.4 | 8.4 | 8.4 | 8.4 |
| | | | 8.4 | 8.4 | 8.4 | 8.4 | 8.4 | 8.4 | 8.4 | 8.4 | 8.4 | 8.4 | 8.4 |
| | | 8.4 | 8.4 | 8.4 | 8.4 | 8.4 | 8.4 | 8.4 | 8.4 | | | | |
| | 8.4 | 8.4 | 8.4 | 8.4 | 8.4 | 8.4 | 8.4 | | | | | | |
| 8.4 | 8.4 | 8.4 | 8.4 | 8.4 | 8.4 | 8.4 | | | | | | | |

FIG. 30

BREAKDOWN VOLTAGE WHEN NEW UV AND ION FILTER ARE USED IN COMBINATION

UNIT [V]

| | | | | | | | | | | | | |
|---|---|---|---|---|---|---|---|---|---|---|---|---|
| | | | | 8.6 | 8.6 | 8.6 | 8.6 | 8.6 | 8.6 | 8.6 | | |
| | | | 8.6 | 8.6 | 8.6 | 8.6 | 8.6 | 8.6 | 8.6 | 8.6 | | |
| | | 8.6 | 8.6 | 8.6 | 8.6 | 8.6 | 8.6 | 8.6 | 8.6 | 8.6 | 8.6 | |
| | 8.6 | 8.6 | 8.6 | 8.6 | 8.6 | 8.6 | 8.6 | 8.6 | 8.6 | 8.6 | 8.6 | 8.6 |
| | 8.6 | 8.6 | 8.6 | 8.6 | 8.6 | 8.6 | 8.6 | 8.6 | 8.6 | 8.6 | 8.6 | 8.6 |
| 8.6 | 8.6 | 8.6 | 8.6 | 8.6 | 8.6 | 8.6 | 8.6 | 8.6 | 8.6 | 8.6 | 8.6 | |
| 8.6 | 8.6 | 8.6 | 8.6 | 8.6 | 8.6 | 8.6 | 8.6 | 8.6 | 8.6 | 8.6 | 8.6 | |
| 8.6 | 8.6 | 8.6 | 8.6 | 8.6 | 8.6 | 8.6 | 8.6 | 8.6 | 8.6 | 8.6 | | |
| | 8.6 | 8.6 | 8.6 | 8.6 | 8.6 | 8.6 | 8.6 | 8.6 | | | | |
| | 8.6 | 8.6 | 8.6 | 8.6 | 8.6 | 8.6 | 8.6 | | | | | |

FIG. 31

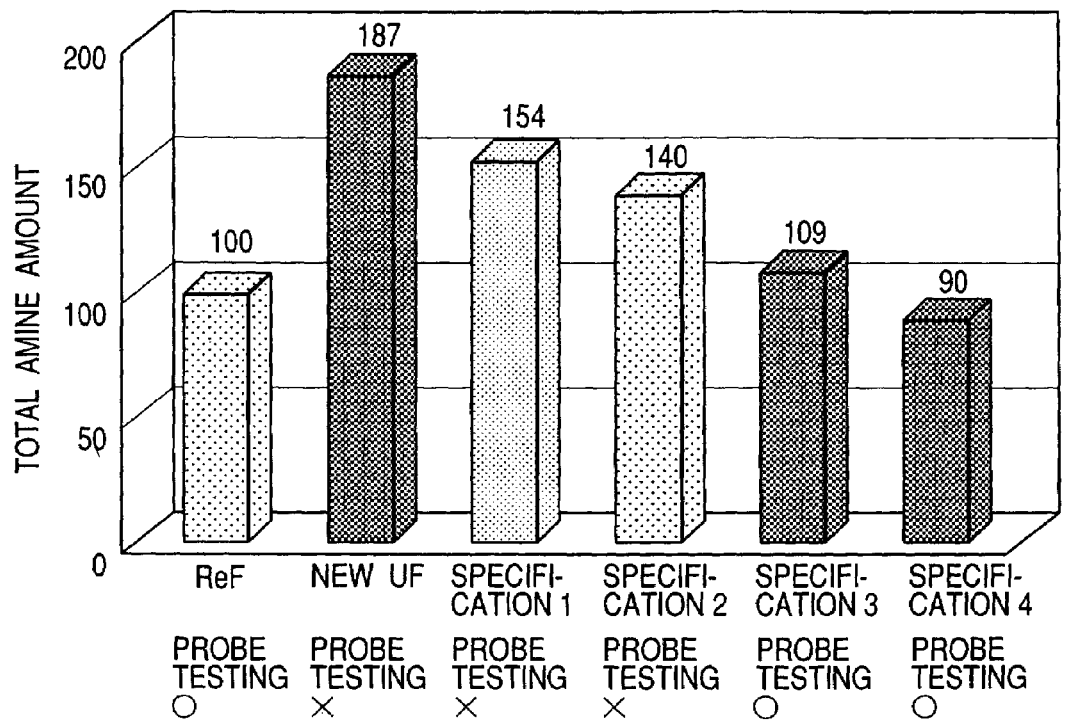

SUPPOSING THAT THE TOTAL AMINE AMOUNT OF ReF IS 100

ReF: UF EQUIPMENT INSTALLED WITH A UF MODULE WHICH HAS BEEN USED LONG
NEW UF: UF EQUIPMENT INSTALLED WITH A NEW UF MODULE
SPECIFICATION 1: SPECIFICATION IN WHICH A NEW UF MODULE IS INSTALLED IN A UF EQUIPMENT AFTER THE MODULE IS CLEANED WITH PURE WATER FOR 2 WEEKS
SPECIFICATION 2: SPECIFICATION IN WHICH A NEW UF MODULE IS INSTALLED IN A UF EQUIPMENT AFTER THE MODULE IS CLEANED WITH PURE WATER FOR 6 WEEKS
SPECIFICATION 3: SPECIFICATION IN WHICH AN ION REMOVING FILTER (ION EXCHANGE RESIN TYPE) IS DISPOSED DOWNSTREAM OF A UF EQUIPMENT INSTALLED WITH A NEW UF MODULE
SPECIFICATION 4: SPECIFICATION IN WHICH AN ION FILTER IS DISPOSED DOWNSTREAM OF A UF EQUIPMENT INSTALLED WITH A NEW UF MODULE

FABRICATION METHOD OF
SEMICONDUCTOR INTEGRATED CIRCUIT
DEVICE

This application is a Continuation application of application Ser. No. 10/364,506, filed Feb. 12, 2003 now abandoned, which is a Divisional application of application Ser. No. 10/266,769, filed Oct. 9, 2002 now abandoned, the contents of which are incorporated herein by reference in their entirety.

BACKGROUND OF THE INVENTION

The present invention relates to a method of fabrication of a semiconductor integrated circuit device; and, more particularly, the invention relates to a technique for improving the quality of pure water to be used for the fabrication of a semiconductor integrated circuit device.

Upon fabrication of a semiconductor device, including microfabrication of an integrated circuit, it is required to remove impurities from the surface or interface of a semiconductor wafer (which will hereinafter simply be called a "wafer") by cleaning, thereby maintaining the cleanness of the wafer. Foreign matter on a wafer may cause disconnection or short-circuit of wiring. In particular, heavy metal components must be removed completely, because they have a serious influence on the electrical properties of the device.

Pure water is used for washing a wafer surface to remove a chemical solution after the wafer has been cleaned therewith or wet etched therewith, thereby making the wafer clean; or pure water is used for preparing a chemical solution used in a cleaning or wet etching step. Pure water used in such a step is prepared by removing, from raw water, fine particles, organic matter and high molecular ions by use of an RO (reverse osmosis) unit equipped with an RO (Reverse Osmosis) membrane, removing the other ions by using an ion exchange resin, and then removing fine particles and living bacteria, which are still in the raw water after the action of the RO unit and ion exchange resin, using UF equipment (ultrafiltration equipment). A process for preparation of such pure water is disclosed, for example, in Japanese Unexamined Patent Application No. Hei 4(1992)-78483. Also, Japanese Unexamined Patent Application No. Hei 10(1998)-216721 discloses a technique for removing anions, which are too small to pass through UF equipment, using an anion adsorption membrane apparatus disposed downstream of the UF equipment.

SUMMARY OF THE INVENTION

The present inventors have investigated the possibility to construct a system for obtaining pure water having high purity (which will hereinafter be called "ultrapure water") to be used for the fabrication of a semiconductor Integrated circuit device. During the investigation, they found that the problems as described below occur.

UF equipment is used in the final step of the preparation of ultrapure water. The UF equipment has a moduled filter obtained by bundling a plurality of capillary hollow fiber membranes using an adhesive which contains an epoxy resin as a raw material. This filter needs periodic replacement with a new one owing to the life of its material. The adhesive used for bundling the hollow fiber membranes contains an amine, and a portion of this amine has been ionized. When water is caused to pass through this UF equipment, after replacement of the filter, this ionized amine is hydrolyzed and is transferred into the ultrapure water. If ultrapure water containing this ionized amine is used, for example, for cleaning a wafer just before the formation of a gate oxide film of a MISFET (Metal Insulator Semiconductor Field Effect Transistor), the Si (silicon) which constitutes the wafer is inevitably etched by this ionized amine, resulting in the formation of an unevenness on the interface between the gate insulating film and the wafer after formation of the gate insulating film. When the MISFET formed under such a state constitutes a memory cell of an electrically erasable programmable read only memory (EEPROM; which will hereinafter be called "flash memory"), the breakdown voltage of the gate insulating film is lowered, leading to the problem of a deterioration in the write characteristics to the memory cell, as well as the erase characteristics thereof. Even if the above-described MISFET is used for semiconductor devices other than the memory cell of a flash memory, an electric current between the source and the drain is disturbed, causing a failure in the characteristics.

A test made by the present inventors has revealed that the ionized amine comes also from the RO unit and ion exchange resin. There is a possibility that such an ionized amine coming from a place other than the UF equipment flows into the ultrapure water.

An object of the present invention is to prevent run-off of an ionized amine into ultrapure water upon preparation of the ultrapure water to be used for the fabrication of a semiconductor integrated circuit device.

The above-described and the other objects and novel features of the present invention will be apparent from the following description herein and the accompanying drawings.

Typical aspects of the invention, among those disclosed in the present application, will be summarized briefly below.

In one aspect of the present invention, there is provided a method of fabrication of a semiconductor integrated circuit device, which comprises introducing indifferent water, as first raw material water, into a primary pure water system having a primary purifying system; introducing, as second raw material water, the primary pure water, which has been obtained by purification through the primary purifying system, into a secondary pure water circulating system having a secondary purifying system; and feeding a first wet treatment apparatus with the secondary pure water which has been obtained by purification through the secondary purifying system, thereby subjecting a semiconductor integrated circuit wafer to first wetting treatment, wherein, in the secondary purifying system, there are an ion removing step through use of an ion removing filter, a foreign particle removing step through use of an ultrafiltration filter, and a step of feeding the first wetting treatment apparatus with pure water which has passed through the ion removing filter and the ultrafiltration filter, and by the time when the pure water is fed to the first wetting treatment apparatus, ionized amines or ionized amine substances have been removed from the secondary pure water to such an extent as not to affect the characteristics of the semiconductor integrated circuit device.

In another aspect of the present invention, there is also provided a method of fabrication of a semiconductor integrated circuit device, which comprises introducing, as first raw material water, indifferent water into a primary pure water system having a primary purifying system; introducing, as second raw material water, the primary water, which has been obtained through the primary purifying system, into a secondary pure water circulating system having a secondary purifying system; and feeding a first wetting treatment apparatus with the secondary pure water which has been obtained by purification of the second raw material water through the secondary purifying system, thereby subjecting a semiconductor integrated circuit wafer to first wetting treatment; wherein, in the secondary purifying system, there are a step of removing foreign particles from pure water through use of an ultrafiltration filter; a step of removing ions from the pure water, which has passed through the ultrafiltration filter, by use of a membrane type ion removing filter; and a step of feeding the first wetting treatment apparatus with the pure water which has passed through the ion removing filter.

In a further aspect of the present invention, there is also provided a method of fabrication of a semiconductor integrated circuit device, which comprises introducing, as first raw material water, indifferent water into a primary pure water system having a primary purifying system; introducing, as second raw material water, the primary water, which has been obtained through the primary purifying system, into a secondary pure water circulating system having a secondary purifying system; and feeding a first wetting treatment apparatus with secondary pure water which has been obtained by purification through the secondary purifying system, thereby subjecting a semiconductor integrated circuit wafer to first wetting treatment; wherein, in the secondary purifying system, there are a step of removing foreign particles from pure water through use of an ultrafiltration filter disposed in the secondary purifying system; a step of removing ions from the pure water, which has passed through the ultrafiltration filter, by use of a membrane type ion removing filter that is disposed outside of the secondary pure water circulating system; and a step of feeding the first wetting treatment apparatus with the pure water which has passed through the ion removing filter.

In a still further aspect of the present invention, there is also provided a method of fabrication of a semiconductor integrated circuit device, which comprises introducing, as first raw material water, indifferent water into a primary pure water system having a primary purifying system; introducing, as second raw material water, the primary water, which has been obtained through the primary purifying system, into a secondary pure water circulating system having a secondary purifying system; and feeding a first wetting treatment apparatus with the secondary pure water which has been obtained by purification through the secondary purifying system, thereby subjecting a semiconductor integrated circuit wafer to first wetting treatment, wherein: in the secondary purifying system, there are a step of removing ions from pure water through use of an ion removing filter that is disposed inside of the secondary purifying system; a step of causing the pure water, which has passed through the ion removing filter, to pass through a heat welding type ultrafiltration filter that is disposed inside of the secondary purifying system, thereby removing foreign particles from the pure water; and a step of feeding the first wetting treatment apparatus with the pure water which has passed through the ultrafiltration filter.

In a still further aspect of the present invention, there is also provided a method of fabrication of a semiconductor integrated circuit device, which comprises introducing, as first raw material water, indifferent water into a primary pure water system having a primary purifying system; introducing, as second raw material water, the primary water, which has been obtained through the primary purifying system, into a secondary pure water circulating system having a secondary purifying system; and feeding a first wetting treatment apparatus with the secondary pure water which has been obtained by purification through the secondary purifying system, thereby subjecting a semiconductor integrated circuit wafer to first wetting treatment; wherein, in the secondary purifying system, there are a step of removing ions by use of an ion removing filter, a step of removing foreign particles through a ultrafiltration filter, and a step of feeding the first wetting treatment apparatus with the pure water which has passed through the ion removing filter and the ultrafiltration filter, and wherein the ultrafiltration filter is disposed at a position permitting self cleaning.

The outline of other examples of the invention described in the present application will be described below:

Item 1: A method of fabrication of a semiconductor integrated circuit device, which comprises cleaning a semiconductor substrate or preparing a chemical solution with pure water prepared by a pure water preparation step having the sub-steps of:

(a) removing first foreign matter from raw water containing foreign matter, and (b) removing, after the sub-step (a), foreign matter other than the first foreign matter from the raw water by using a first apparatus equipped with a filter formed by bonding a plurality of hollow fiber membranes at the end portions thereof, wherein the hollow fiber membranes permit passage of only substances having a molecular weight not greater than a predetermined value, the plurality of hollow fiber membranes are heat welded or bonded with an amine-free material, and the first apparatus removes the foreign matter other than the first foreign matter from the raw water by causing the raw water to pass through the filter.

Item 2: The method of fabrication of a semiconductor integrated circuit device according to Item 1, wherein the hollow fiber state membranes are each composed mainly of polysulfone or polyimide.

Item 3: The method of fabrication of a semiconductor integrated circuit device according to Item 1, further comprising heat treating the semiconductor substrate after the cleaning step, thereby forming a gate insulating film.

Item 4: The method of fabrication of a semiconductor integrated circuit device according to Item 3, wherein the gate insulating film is formed to have a film thickness of 20 nm or less.

Item 5: The method of fabrication of a semiconductor integrated circuit device according to Item 1, further comprising, after the cleaning step, forming a nonvolatile memory cell, the nonvolatile memory cell forming step having the following sub-steps:

(c) heat treating the semiconductor substrate, thereby forming a gate insulating film, (d) forming thereover a first conductive film, (e) forming thereover a first insulating film, (f) forming thereover a second conductive film, (g) patterning the second conductive film, thereby forming a control gate electrode made thereof, and (h) patterning the first insulating film and the first conductive film, thereby forming a floating gate electrode made of the first conductive film.

Item 6: The method of fabrication of a semiconductor integrated circuit device according to Item 5, wherein the gate insulating film is formed to have a thickness of 10 nm or less.

Item 7: The method of fabrication of a semiconductor integrated circuit device, which comprises:

(a) removing first foreign matter from raw water containing foreign matter, (b) after the step (a), removing foreign matter other than the first foreign matter from the raw water by using a first apparatus equipped with a filter formed by bonding a plurality of hollow fiber membranes at end portions thereof, and (c) after the step (b), cleaning a semiconductor substrate or preparing a chemical solution with pure water prepared by causing the raw water to pass through a first filter made of a hollow-fiber-type filter membrane having an ion exchange radical, thereby removing ionized amines from the raw water, wherein, the first apparatus is capable of removing foreign matter other than the first foreign matter from the raw water by causing the raw water to pass through the filter.

Item 8: The method of fabrication of a semiconductor integrated circuit device according to Item 7, wherein the step (a) includes a sub-step of removing ions from the raw water through a second filter made of an ion exchange resin having an ion exchange radical or a hollow-fiber-type filter membrane having an ion exchange radical.

Item 9: The method of fabrication of a semiconductor integrated circuit device according to Item 7, which further comprises forming a gate insulating film by heat treating the semiconductor substrate after cleaning.

Item 10: The method of fabrication of a semiconductor integrated circuit device according to Item 9, wherein the gate insulating film is formed to have a film thickness of 20 nm or less.

Item 11: The method of fabrication of a semiconductor integrated circuit device according to Item 7, which further comprises forming a nonvolatile memory cell after the cleaning step, the nonvolatile memory cell forming step having the following sub-steps:

(c) heat treating the semiconductor substrate, thereby forming a gate insulating film, (d) forming thereover a first conductive film, (e) forming thereover a first insulating film, (f) forming thereover a second conductive film, (g) patterning the second conductive film to form a control gate electrode made of the second conductive film, and (h) patterning the first insulating film and first conductive film to form a floating gate electrode made of the first conductive film.

Item 12: The method of fabrication of a semiconductor integrated circuit device according to Item 11, wherein the gate insulating film is formed to have a thickness of 10 nm or less.

Item 13: A method of fabrication of a semiconductor integrated circuit device, which comprises cleaning a semiconductor substrate or preparing a chemical solution with pure water prepared through a pure water preparing step, comprising the sub-steps of:

(a) removing first foreign matter from raw water containing foreign matter, and (b) after the step (a), removing foreign matter other than the first foreign matter by use of a first apparatus equipped with a filter formed by bonding a plurality of hollow fiber membranes at end portions thereof, wherein the sub-step (a) further comprises removing ions from the raw water through use of a second filter made of a hollow-fiber-type filter membrane having an ion exchange radical.

Item 14: The method of fabrication of a semiconductor integrated circuit device according to Item 13, wherein the semiconductor substrate is heat treated after the cleaning step, thereby forming a gate insulating film.

Item 15: The method of fabrication of a semiconductor integrated circuit device according to Item 14, wherein the gate insulating film is formed to have a thickness of 20 nm or less.

Item 16: The method of fabrication of a semiconductor integrated circuit device according to Item 13, which further comprises forming a nonvolatile memory cell after the cleaning step, the non-volatile-memory-cell forming step including the following sub-steps:

(c) heat treating the semiconductor substrate, thereby forming a gate insulating film, (d) forming thereover a first conductive film, (e) forming thereover a first insulating film, (f) forming thereover a second conductive film, (g) patterning the second conductive film to form a control gate electrode made of the second conductive film, and (h) patterning the first insulating film and first conductive film to form a floating gate electrode made of the first conductive film.

Item 17: The method of fabrication of a semiconductor integrated circuit device according to Item 16, wherein the gate insulating film is formed to have a film thickness of 10 nm or less.

Item 18: A method of fabrication of a semiconductor integrated circuit device, which comprises cleaning a semiconductor substrate or preparing a chemical solution with pure water prepared through a pure water preparing step comprising the sub-steps of:

(a) removing first foreign matter from raw water containing foreign matter, and (b) after the step (a), removing foreign matter other than the first foreign matter by use of a first apparatus equipped with a filter formed by bonding a plurality of hollow fiber membranes at end portions thereof; wherein, in a pathway for sending the pure water from the first apparatus to an apparatus in which the cleaning step or chemical solution preparing step is conducted, a first filter made of a hollow-yarn type filter membrane having an ion exchange radical or an ion exchange resin having an ion exchange radical is disposed; and wherein ionized amines are removed from the pure water through use of the first filter.

Item 19: The method of fabrication of a semiconductor integrated circuit device according to Item 18, further comprising heat treating the semiconductor substrate after the cleaning step, thereby forming a gate insulating film.

Item 20: The method of fabrication of a semiconductor integrated circuit device according to Item 19, wherein the gate insulating film is formed to have a film thickness of 20 nm or less.

Item 21: The method of fabrication of a semiconductor integrated circuit device according to Item 18, which further comprises forming a nonvolatile memory cell after the cleaning step, the non-volatile-memory-cell forming step including:

(c) heat treating the semiconductor substrate, thereby forming a gate insulating film, (d) forming thereover a first conductive film, (e) forming thereover a first insulating film, (f) forming thereover a second conductive film, (g) patterning the second conductive film to form a control gate electrode made of the second conductive film, and (h) patterning the first insulating film and first conductive film to form a floating gate electrode made of the first conductive film.

Item 22: The method of fabrication of a semiconductor integrated circuit device according to Item 21, wherein the gate insulating film is formed to have a film thickness of 10 nm or less.

Item 23: A method of fabrication of a semiconductor integrated circuit device, which comprises cleaning a semiconductor substrate or preparing a chemical solution with pure water prepared through use of a pure water preparing step, comprising sub-steps of:

(a) removing first foreign matter from raw water containing foreign matter, and (b) after the step (a), removing foreign matter other than the first foreign matter by use of a plurality of first apparatuses each equipped with a filter formed by bonding a plurality of hollow fiber membranes at end portions thereof, wherein:

the step (a) further comprises:

(a1) removing ions from the raw water by use of a second filter made of an ion exchange resin having an ion exchange radical or a hollow-fiber-type filtration membrane having an ion exchange radical;

the step (a) is followed by at least one of the sub-steps of:

(c) causing a portion of the raw water, which has passed through the second filter, to pass through a new one of the first apparatus or a new one of the second filter and then feeding the resulting purified water to the second filter, and (d) causing the residue of the pure water, after the cleaning step or chemical-solution-preparing step, to pass through at least one of a new one of the first apparatus or a new one of the second filter, and then feeding to the second filter; and the steps (c) and/or (d) are carried out for a predetermined term.

Item 24. The method of fabrication of a semiconductor integrated circuit device according to Item 23, further comprising forming a gate insulating film by heat treating the semiconductor substrate after the cleaning step.

Item 25. The method of fabrication of a semiconductor integrated circuit device according to Item 24, wherein the gate insulating film is formed to have a film thickness of 20 nm or less.

Item 26. The method of fabrication of a semiconductor integrated circuit device according to Item 23, which further comprises forming a nonvolatile memory cell after the cleaning step, the non-volatile-memory-cell forming step including:

(c) heat treating the semiconductor substrate, thereby forming a gate insulating film, (d) forming thereover a first conductive film, (e) forming thereover a first insulating film, (f) forming thereover a second conductive film, (g) patterning the second conductive film to form a control gate electrode made of the second conductive film, and (h) patterning the first insulating film and the first conductive film to form a floating gate electrode made of the first conductive film.

Item 27: The method of fabrication of a semiconductor integrated circuit device according to Item 26, wherein the gate insulating film is formed to have a film thickness of 10 nm or less.

BRIEF DESCRIPTION OF THE DRAWINGS

FIG. 11 is a diagram which illustrates one example of the ion filter illustrated in FIG. 9;

FIG. 12 is a diagram which illustrates one example of the ion filter illustrated in FIG. 9;

FIG. 27 is a schematic diagram illustrating the results of measurement of the breakdown voltage of the gate insulating film when the semiconductor substrate is cleaned with ultrapure water prepared just after replacement, with new ones, of an ion exchange resin type anion removing filter and an ion exchange resin type cation removing filter, each included in the system for preparation of ultrapure water to be used for the fabrication of the semiconductor integrated circuit device according to the one embodiment of the present invention;

FIG. 28 is a schematic diagram illustrating the results of measurement of the breakdown voltage of the gate insulating film when the semiconductor substrate is cleaned with ultrapure water prepared using a UF of the UF equipment which has been used for a long time;

FIG. 29 is a schematic diagram illustrating the results of measurement of the breakdown voltage of the gate insulating film when the semiconductor substrate is cleaned with ultrapure water prepared using UF equipment having a UF replaced with a new one and having a mix deminer disposed downstream of the equipment;

FIG. 30 is a schematic diagram illustrating the results of measurement of the breakdown voltage of the gate insulating film when the semiconductor substrate is cleaned with ultrapure water prepared using UF equipment having a UF replaced with a new one and having, downstream of the equipment, an ion filter with a membrane film;

FIG. 31 is a schematic diagram illustrating the relationship between the amount of ionized amines attached to the semiconductor substrate by cleaning with ultrapure water and the existence or absence of a defective gate insulating film;

DETAILED DESCRIPTION OF THE INVENTION

Figure 1:
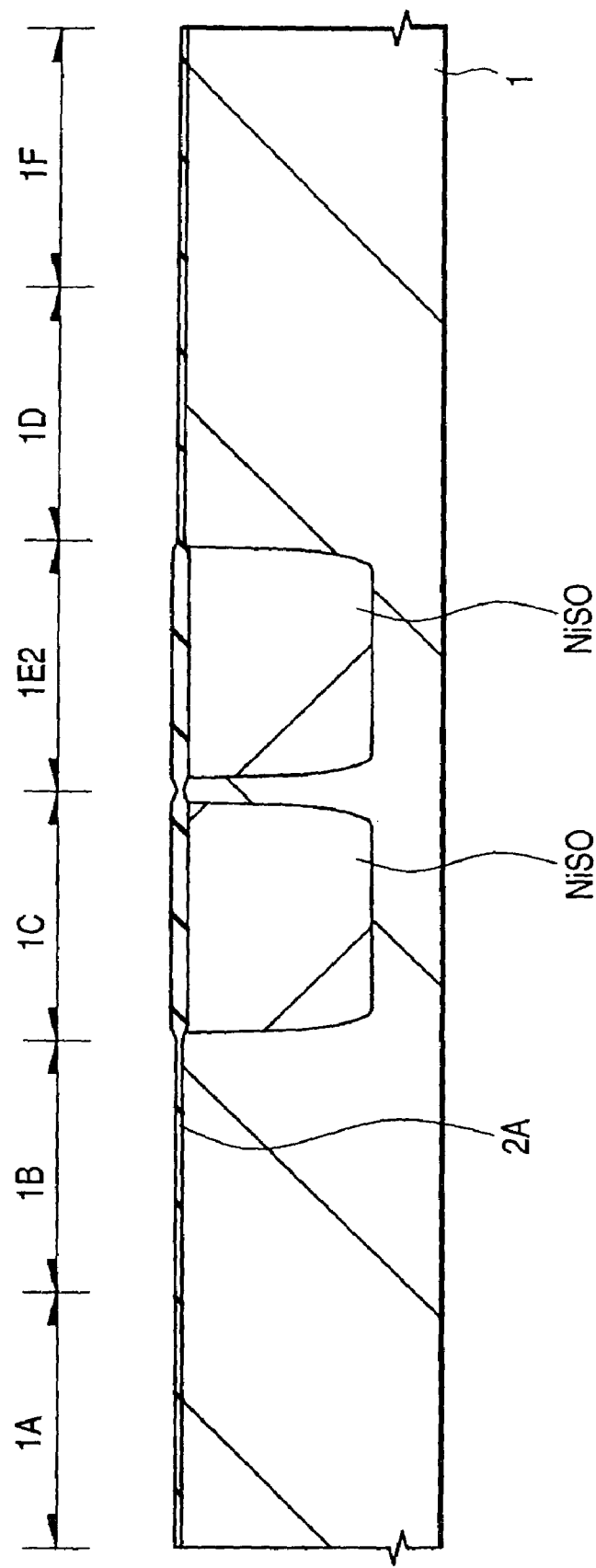
FIG. 1 is a fragmentary cross-sectional view illustrating a step in the fabrication of a semiconductor integrated circuit device according to one embodiment of the present invention.

Prior to a detailed description of the present invention, the meanings of some terms used in this application will be explained below.

The term "wafer" means a single crystalline Si substrate (generally, having a nearly flat and circular shape), a sapphire substrate, a glass substrate or any other insulating, semi-insulating or semiconductor substrate and a composite substrate thereof of the type used for fabricating semiconductor integrated circuit devices. Further, the term "semiconductor integrated circuit device" as used herein means not only those devices fabricated on a semiconductor or insulating substrate, such as a silicon wafer or sapphire substrate, but also those devices fabricated on another insulating substrate, such as glass, for example, TFT (Thin-Film-Transistor) or STN (Super-Twisted-Nematic) liquid crystals, unless otherwise specifically indicated.

The term "device surface" means a main surface of a substrate on which device patterns corresponding to a plurality of chip regions are formed by lithography.

The term "resist pattern" means a film pattern obtained by patterning a photosensitive resin film (resist film) by photolithography. This pattern includes a simple resist film free of openings at such a portion.

The term "UF equipment" (Ultrafiltration Equipment) means pressure filtration equipment for separating molecules according to their size through use of an ultra filter (UF). In this equipment, separation is carried out at a molecular cutoff range of about thousands to hundreds of thousands. The term "ultra filter" embraces a hollow fiber type ultra filter and a spiral type ultra filter.

The term "ion exchange resin" means a synthetic resin having a capacity of adsorbing thereto ions existing in water, thereby removing them from the water. It can be classified into two types, that is, a cation exchange resin for adsorbing and removing cations ($Na^+$, $Ca^{2+}$, $Mg^{2+}$, etc.) and an anion exchange resin for adsorbing and removing anions ($Cl^-$, $SO_4^{2-}$, $SiO_2$, etc.). The term "ion exchange resin type ion removing filter" embraces a cation removing filter for removing cations, an anion removing filter for removing anions and a mixed ion removing filter for removing both cations and anions.

The term "RO unit" (Reverse Osmosis unit) means an apparatus for removing ions, organic matter, fine particles and living bacteria in water through use of an RO film, which is a filter membrane to which reverse osmosis has been applied.

The term "vacuum degasifier" means an apparatus for spraying water in a vacuum atmosphere, thereby removing a dissolved gas in water.

The term "indifferent water" means water which will serve as a raw material for obtaining high purify water to be used for the fabrication of a semiconductor integrated circuit device. River water, ground water (including well water) or the like is employed for this purpose.

The term "primary pure water" means high purity water from which almost all of the impurities, such as ions, fine particles, microorganisms and organic matter, have been removed from treatment water (indifferent water).

The term "ultrapure water" means water which is obtained by removing a trace of impurities, such as fine particles, living bacteria, TOC (total organic carbon), ions and dissolved oxygen remaining in primary water, thereby having a markedly high purity, and which is to be used, for example, for the cleaning of a wafer.

The term "primary pure water unit" means one of a unit constituting an ultrapure water preparing system. It is formed of a reverse osmosis unit, an ion exchanging apparatus and a degasifier, and it prepares primary pure water by removing almost all of the impurities, such as fine particles, ions, microorganisms and organic matters, from water passing through a pretreatment apparatus.

The term "pretreatment system" means a system including apparatuses for removing colloidal matter, particulate matter and bacteria from raw water by physical and chemical treatments prior to the feeding of the raw water to a primary pure water unit.

The term "subsystem" means a system which is disposed in the vicinity of a point of use and prepares ultrapure water by using, as raw water, primary pure water. It comprises a UV sterilizer, a cartridge polisher and a pressure filter.

The term "ultrapure water preparing system" means a system for preparing high purity water by separating impurities from raw water, such as tap water, industrial water, well water or river water, through use of an ion exchange resin membrane or a filter membrane, thereby purifying it. The system comprises a pretreatment unit, a primary pure water unit and a subsystem.

The term "point of use" means a site at which ultrapure water fed from a subsystem is taken out for the purpose of wafer cleaning and provided for use.

The term "TOC (total organic carbon)" means an organic carbon contained in ultrapure water, and it embraces that material produced from raw water (natural water or recovered water) or that has escaped from the members being used, such as an ion exchange resin or pipe.

The term "ultrafiltration membrane" means a plastic porous thin-film filter having numerous uniform pores, and which is made of cellulose nitrate, cellulose acetate, acetyl cellulose, nitrocellulose, nylon, Teflon, polyvinyl chloride or ethylene tetrafluoride resin.

The term "new" means an apparatus or member which has not been used, and it also embraces one that has been used for a predetermined term. With regards to the UF referred to in the below-described embodiment, this predetermined term corresponds to the term until discharge of ionized amine outside the UF equipment terminates in the case where the UF is made of an amine-containing material. This predetermined term varies, depending on the specification of the UF or the amount of water fed to the UF. In the below-described embodiment, the predetermined term is about 1 month, preferably about 2 months, more preferably about 3 months, after its use is started.

In the below-described embodiment, when reference is made to a number of elements (including the number, value, amount and range), the number of elements is not limited to a specific number, but can be greater than or less than the specific number, unless otherwise specifically indicated, or in the case where it is principally apparent that the number is limited to the specific number.

Moreover in the below-described embodiment, it is needless to say that the constituting elements (including element steps) are not always essential unless otherwise specifically indicated or in the case where it is principally apparent that they are essential.

Similarly, in the below-described embodiment, when a reference is made to the shape or positional relationship of the constituting elements, that which is substantially analogous or similar to it is also embraced, unless otherwise specifically indicated, or in the case where it is utterly different in principle. This also applies to the above-described value and range.

In all the drawings for describing the below-described embodiment, members having a like function will be identified by like reference numerals and overlapping descriptions thereof will be omitted.

In the below-described embodiments, MISFET (Metal Insulator Semiconductor Field Effect Transistor) representing an electric field transistor will be abbreviated as MIS, while a p-channel type MISFET and an n-channel type MISFET will be abbreviated as pMIS and nMIS, respectively.

The embodiments of the present invention will hereinafter be described specifically based on the accompanying drawings.

In this embodiment, the present invention is applied to a method of fabrication of a flash memory (semiconductor integrated circuit device). This method of fabrication of a flash memory will be described next in the order of the steps thereof with reference to FIGS. 1 to 41.

As illustrated in FIG. 1, a semiconductor substrate (semiconductor integrated circuit wafer) 1 on which the flash memory of this embodiment is to be formed has, for example, a region 1A in which a 5V type nMIS is formed, a region 1B in which a 5V type pMIS is formed, a region 1C in which a MIS which is to be a memory cell of a flash memory is formed, a region 1D in which a high breakdown-voltage one-side offset nMIS Is formed, a region 1E2 in which a high breakdown-voltage loading nMIS is formed and a region 1F in which a high breakdown-voltage one-side offset pMIS is formed.

First, the semiconductor substrate 1 made of p type single crystal silicon Si is cleaned with dilute hydrofluoric acid (HF) and ultrapure water, followed by oxidizing treatment on the surface of the substrate to form a silicon oxide film 2A thereover. After deposition of a silicon nitride film (not illustrated) over the silicon oxide film 2A, the silicon nitride film is etched to selectively leave the silicon nitride film over the silicon oxide film 2A.

Using the resulting silicon nitride film as a mask, an impurity (for example, P (phosphorus)) having an n type conductivity is introduced into the semiconductor substrate 1 by ion implantation. After selectively thickening, by oxidizing treatment, a portion of the silicon oxide film 2A in a region having no silicon nitride film formed thereover, the silicon nitride film is removed using, for example, hot phosphoric acid. The semiconductor substrate 1 is then cleaned with $NH_4OH$ (ammonium hydroxide)/$H_2O_2$ (hydrogen peroxide)/$H_2O$, dilute hydrofluoric acid and ultrapure water. The substrate 1 is heat treated to diffuse the above-described impurity, whereby an n type isolation region NiSO is formed.

Figure 2:
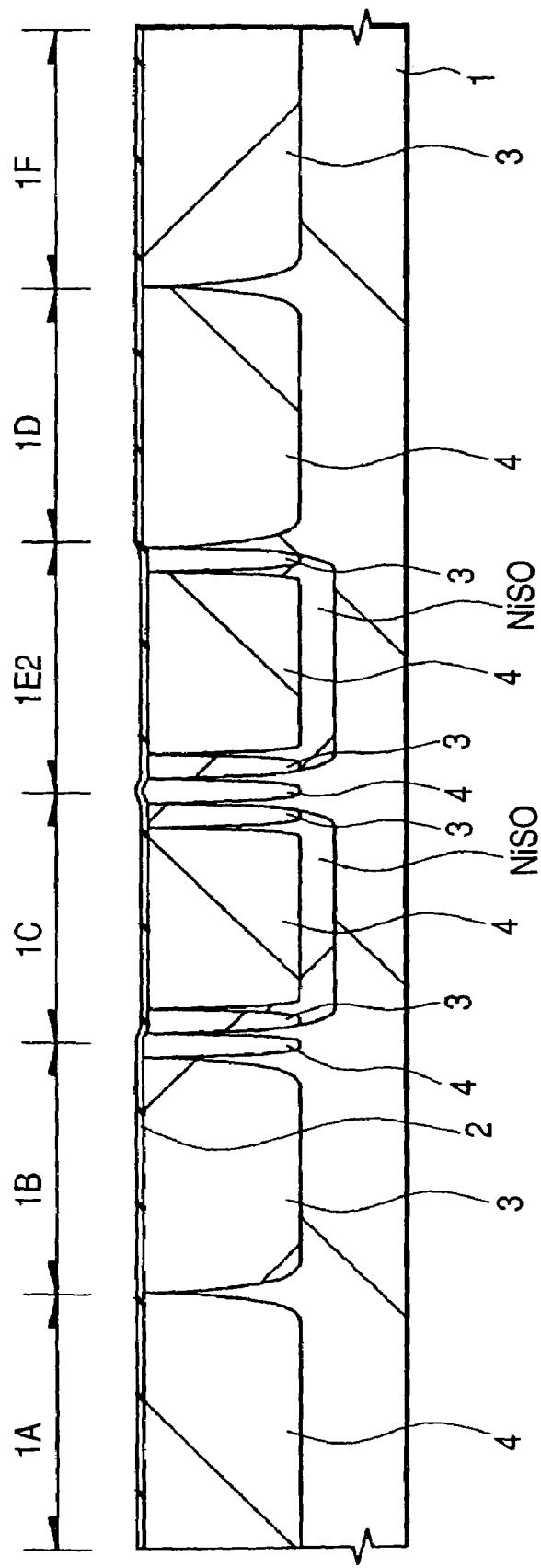
FIG. 2 is a fragmentary cross-sectional view of the semiconductor integrated circuit device during the fabrication step following the step of FIG. 1.

As illustrated in FIG. 2, after cleaning the semiconductor substrate 1 with dilute hydrofluoric acid and ultrapure water, oxidizing treatment is conducted on the surface of the substrate to form a silicon oxide film 2 thereover. Using a photoresist film (not illustrated) patterned by photolithography as a mask, an impurity (for example, P) having an n type conductivity is introduced into the semiconductor substrate 1 by ion implantation. After removal of the photoresist film, using another photoresist film (not illustrated) patterned by photolithography as a mask, an impurity (for example, $BF_2$ (boron difluoride) having a p type conductivity is introduced into the semiconductor substrate 1 by ion implantation. The semiconductor substrate 1 is then cleaned with $NH_4OH/H_2O_2/H_2O$, hydrofluoric acid and ultrapure water, followed by heat treatment to diffuse these impurities, whereby an n type well 3 and a p type well 4 are formed.

Figure 3:
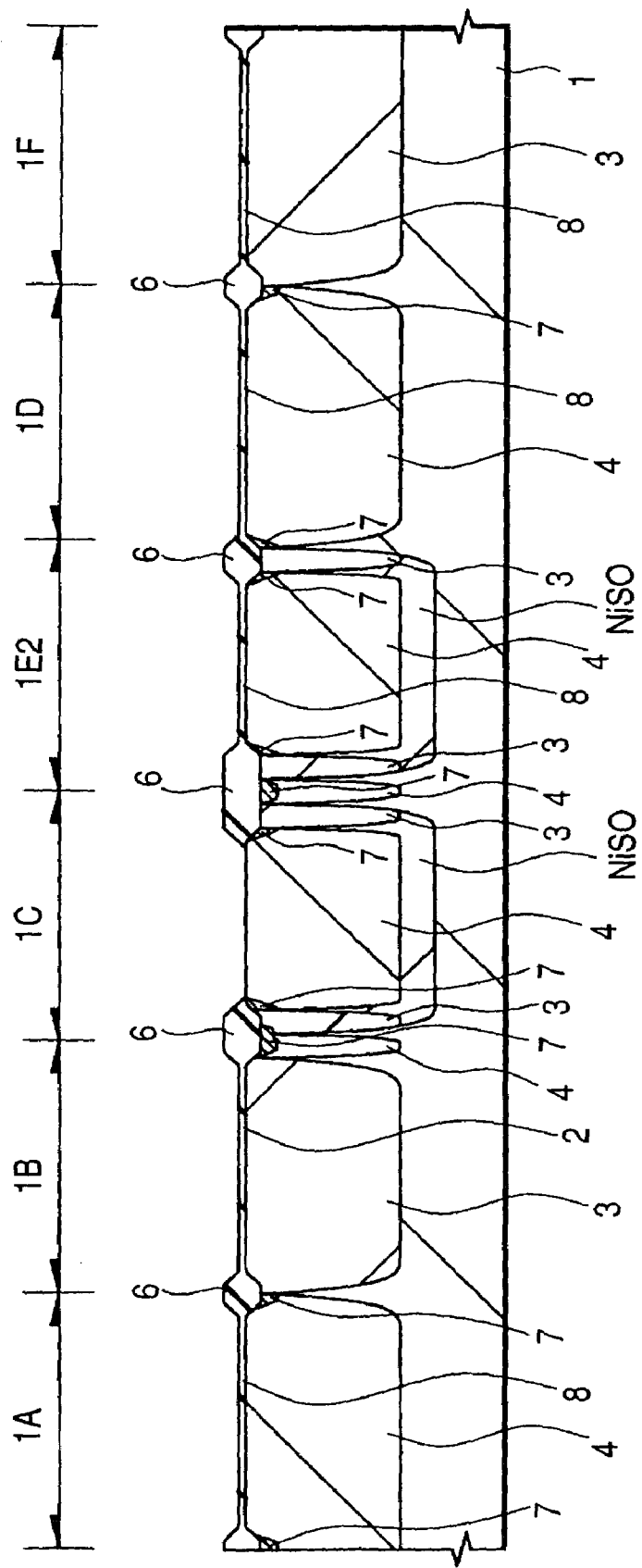
FIG. 3 is a fragmentary cross-sectional view of the semiconductor integrated circuit device during the fabrication step following the step of FIG. 2.

As illustrated in FIG. 3, the surface of the semiconductor substrate 1 is oxidized to form a silicon oxide film (not illustrated) thereover. After deposition of a silicon nitride film (not illustrated) over the silicon oxide film, the silicon nitride film is etched with a photoresist film (not illustrated) as a mask to selectively leave the silicon nitride film over the silicon oxide film. The photoresist film is removed. The semiconductor substrate 1 is then cleaned with $NH_4OH/H_2O_2/H_2O$, followed by further cleaning with $HCl/H_2O_2/H_2O$. By a selective oxidization method, a field insulating film 6 for element isolation is formed over the surface of the semiconductor substrate 1.

Using a photoresist film patterned by photolithography as a mask, an impurity (for example, $BF_2$) having a p type conductivity is introduced by ion implantation. The impurity is diffused by heat treatment, whereby a p type channel stopper region 7 is formed. The silicon nitride film remaining on the semiconductor substrate 1 is then removed using, for example, hot phosphoric acid.

Figure 4:
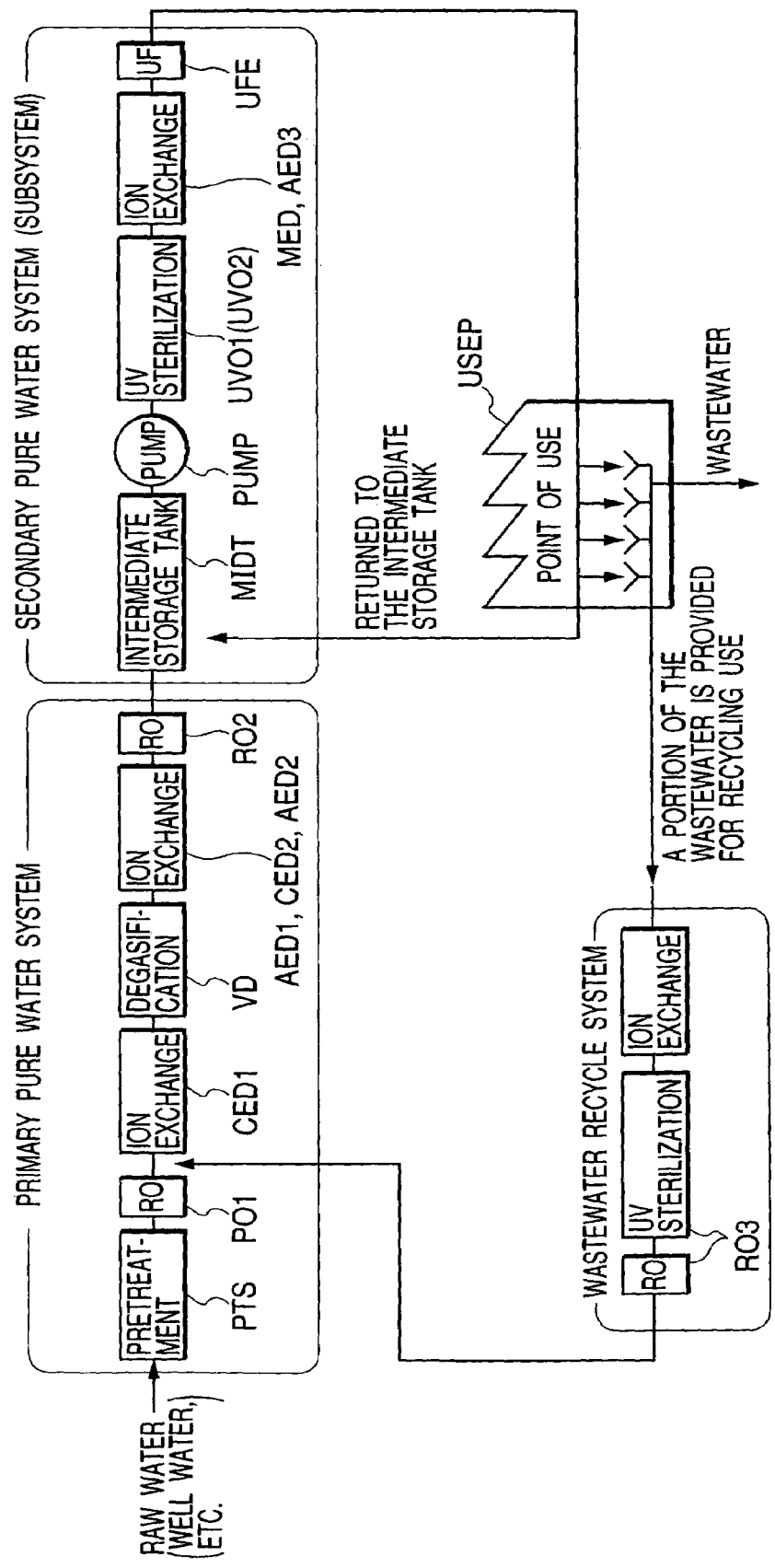
FIG. 4 is a schematic diagram illustrating the system used in preparing ultrapure water to be used for the fabrication of the semiconductor integrated circuit device according to the one embodiment of the present invention.
Figure 5:
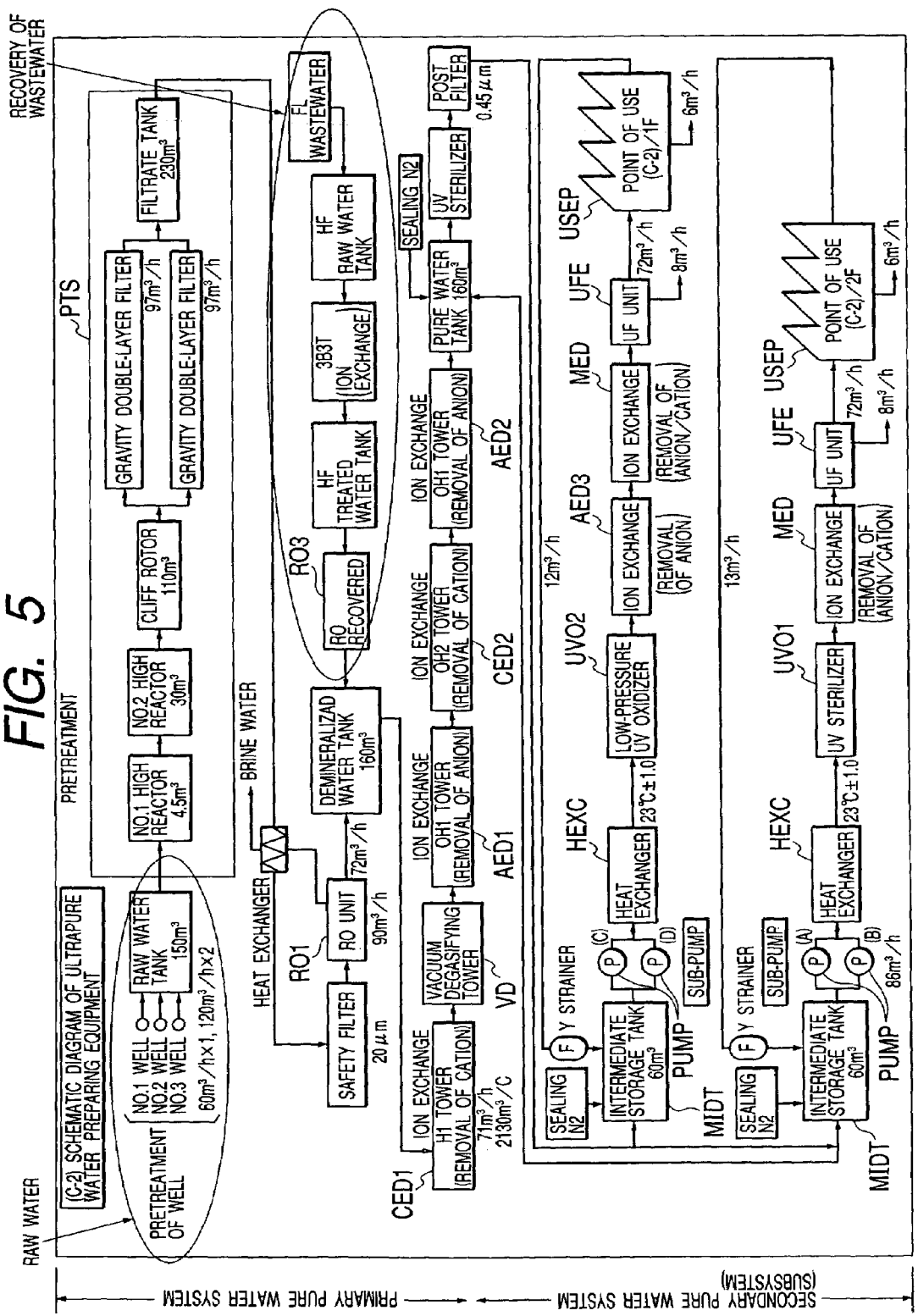
FIG. 5 is a schematic diagram illustrating details of the ultrapure water preparing system illustrated in FIG. 4.

The semiconductor substrate 1 is then cleaned with dilute hydrofluoric acid and ultrapure water. The ultrapure water used in this Embodiment is prepared by a system as illustrated in FIGS. 4 and 5. FIG. 4 is a schematic diagram illustrating the outline of the ultrapure water preparing system of this Embodiment, while FIG. 5 is a schematic diagram illustrating one example of the details of the ultrapure water preparing system illustrated in FIG. 4. A technique relating to such a ultrapure water preparing system is also described in Japanese Patent Application No. 2001-314813 by the present inventors.

As illustrated in FIGS. 4 and 5, by the pretreatment system (primary purifying system) PTS, groundwater (indifferent water (first raw material water) which will hereinafter be called "raw water") pumped up from a well is subjected to chemical and physical treatments to remove colloidal matter (first foreign matter), particulate matter (first foreign matter) and bacteria (first foreign matter) from the raw water. By use of an RO unit (primary purifying system) RO1, fine particles (first foreign matter), organic matter (first foreign matter), bacteria (first foreign matter) and high molecular ions (first foreign matter) are removed from the raw water. By use of an ion exchange resin type cation removing filter (primary purifying system) CED1, cations (first foreign matter) are removed from the raw water, followed by removal of a dissolved gas in the raw water by a vacuum degasifier (VD). By an ion exchange resin type anion removing filter (primary purifying system) AED1, anions (first foreign matter) are removed from the raw water. After removal of cations (first foreign matter) from the raw water by an ion exchange resin type cation removing filter (primary purifying system), anions are removed from the raw water by an ion exchange resin type anion removing filter (primary purifying system) AED2. Downstream thereof, an RO unit RO2 (not illustrated in FIG. 5) may be disposed to remove, from the raw water, fine particles generated from the anion and cation removing filters. Through the above-described steps, primary pure water can be prepared from the raw water. The primary pure water system (pretreatment system) described here is made up of units used for preparing primary pure water from the raw water.

The primary pure water (second raw material water) thus prepared is then fed to an intermediate storage tank (secondary purifying system) MIDT, followed by delivery to a heat exchanger (secondary purifying system) HEXC by a pump (secondary purifying system) PUMP. While the primary pure water is kept at a fixed temperature by means of the heat exchanger HEXC, it is fed to an UV sterilizer (secondary purifying system) UV01 or a low-pressure UV oxidizer (secondary purifying system) UVO2, in which the primary pure water is oxidized or sterilized by exposure to UV rays. The primary pure water sterilized by the UV sterilizer UVO1 is caused to pass through an ion exchange resin type mixed ion removing filter (secondary purifying system) MED to remove cations and anions, and it then delivered to UF equipment (first equipment) UFE. Fine particles and the like, which cannot be removed by the RO unit and ion removing filter, can be removed by the UF equipment UFE, making it possible to prepare ultrapure water (secondary pure water) to be used for the fabrication of the semiconductor integrated circuit device of this Embodiment and to feed the thus prepared ultrapure water to a point of use USEP. The secondary pure water system (subsystem (secondary pure water circulating system)) is formed of each equipment for preparing ultrapure water from primary pure water and point of use USEP.

Of the ultrapure water sent to the point of use USEP, a portion of it which has not been used up at the point of use USEP can be returned to the intermediate storage tank MIDT for recycling. Of the ultrapure water used at the point of use USEP (which water will hereinafter be called "wastewater"), that which is re-usable as ultrapure water is subjected to ion exchange to remove cations and anions. The wastewater is then subjected to sterilizing treatment and treatment for removal of impurities, such as fine particles, organic matter, bacteria and high molecular ions, by using an RO unit RO3 having a sterilizing capacity by exposure to ultraviolet rays and a fine-particle removing capacity through use of an RO membrane. After various treatments as described above, the wastewater, together with the raw material treated by the RO unit RO1, is sent to the cation removing filter CED1. After these steps, a portion of the wastewater becomes re-usable as ultrapure water.

Figure 6:
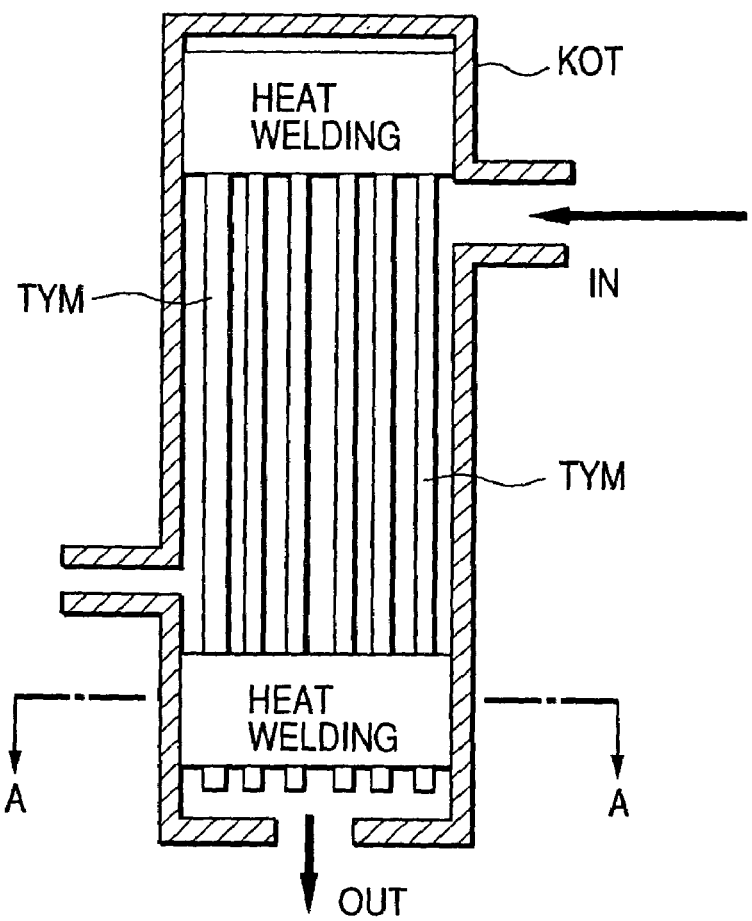
FIG. 6 is a schematic cross-sectional view of a UF module of UF equipment included in the system used on the preparation of ultrapure water to be used for the fabrication of the semiconductor integrated circuit device according to the one embodiment of the present invention.
Figure 7:
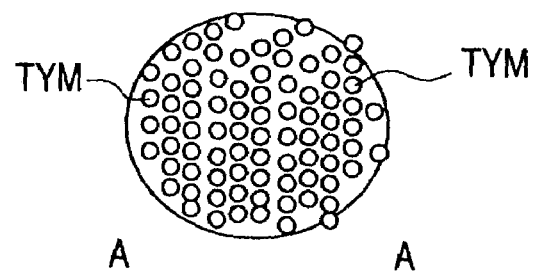
FIG. 7 is a fragmentary cross-sectional view of the UF module, taken along line A—A in FIG. 6.
Figure 8:
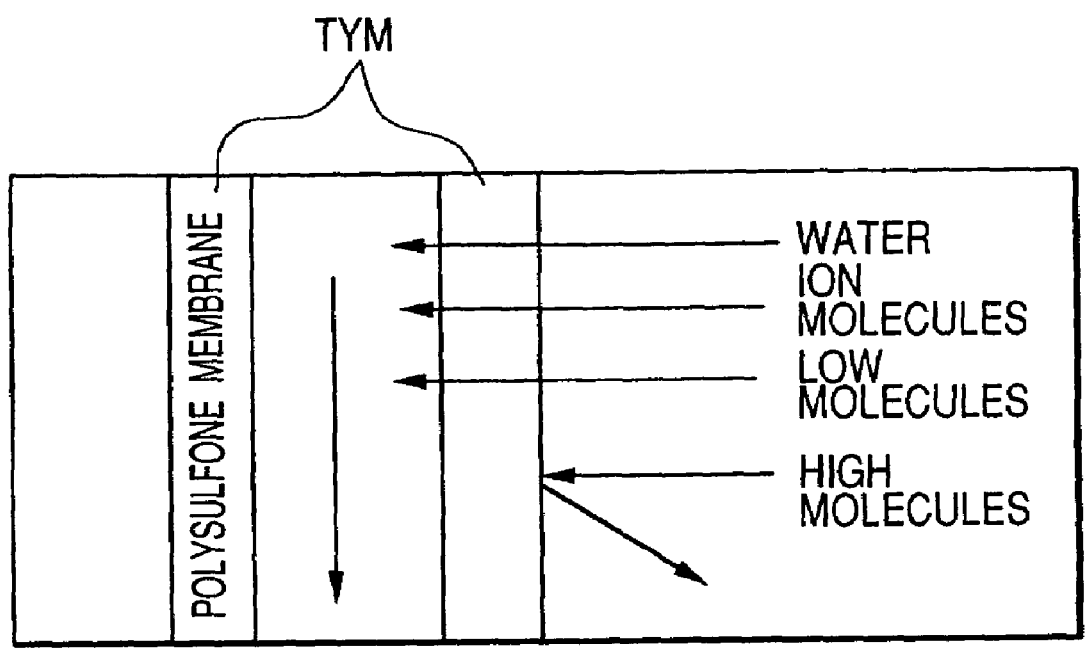
FIG. 8 is a schematic diagram of a hollow fiber membrane constituting the UF module illustrated in FIG. 6.

FIG. 6 is a schematic diagram of a UF module of the UF equipment UFE illustrated in FIGS. 4 and 5. FIG. 7 is a cross-sectional view taken along a line A—A of FIG. 6. The UF module in this Embodiment is made by disposing, in a body KOT, a plurality of capillary hollow fiber membranes TYM that are formed from a polysulfone membrane or polyimide membrane, bonding these plurality of hollow fiber membranes TYM at end portions thereof by hot welding, and by this hot welding, adhering these hollow fiber membranes TYM to the body. As illustrated in FIG. 8, the hollow fiber membranes are each made of a polysulfone membrane or polyimide membrane so that water, ion molecules and low molecules can penetrate inside of the hollow fiber membranes TYM, but high molecules cannot. Since the plurality of hollow fiber membranes TYM are hot welded to each other at end portions thereof in the body KOT and the hollow fiber membranes TYM are adhered to the body, there is discharged from the UF module only primary pure water which has penetrated inside of the hollow fiber membranes TYM, and thereby it is deprived of high molecules, that is, ultrapure water.

When the plurality of hollow fiber membranes TYM are bonded to each other at end portions thereof by an adhesive containing an epoxy resin as its raw material, the adhesive typically contains an amine, and a portion of this amine exists in an ionized form. In this Embodiment, on the other hand, the plurality of hollow fiber membranes TYM are hot welded at end portions thereof so that the adhered portions do not contain an amine. Therefore, use of the UF module of this Embodiment makes it possible to prevent the discharge of an ionized amine which will otherwise occur when primary pure water is fed to the UF module and the ionized amine is hydrophilized and then, discharged as a mixture with ultrapure water. Even if ultrapure water prepared by the ultrapure water preparing system according to this Embodiment is used for a cleaning step of the semiconductor substrate 1 just before the formation of a gate oxide film of the MISFET, which will be a memory cell of a flash memory, it is possible to prevent an inconvenience, such as the formation of an unevenness on the interface between a gate oxide film and the semiconductor substrate 1 after formation of the gate oxide film, which will otherwise be caused by etching of the semiconductor substrate by the ionized amine. This results in the prevention of lowering in the breakdown voltage of the gate oxide film, thereby making it possible to prevent deterioration in the write characteristics and erase characteristics. Lowering in the breakdown voltage of the gate oxide film can be prevented so that even in a MISFET other than a memory cell, the smooth flow of electric current between the source and drain is not disturbed. In this Embodiment, the plurality of hollow fiber membranes TYM are bonded to each other by hot welding, but hot welding may be replaced with bonding via an amine-free urethane material.

Figure 9:
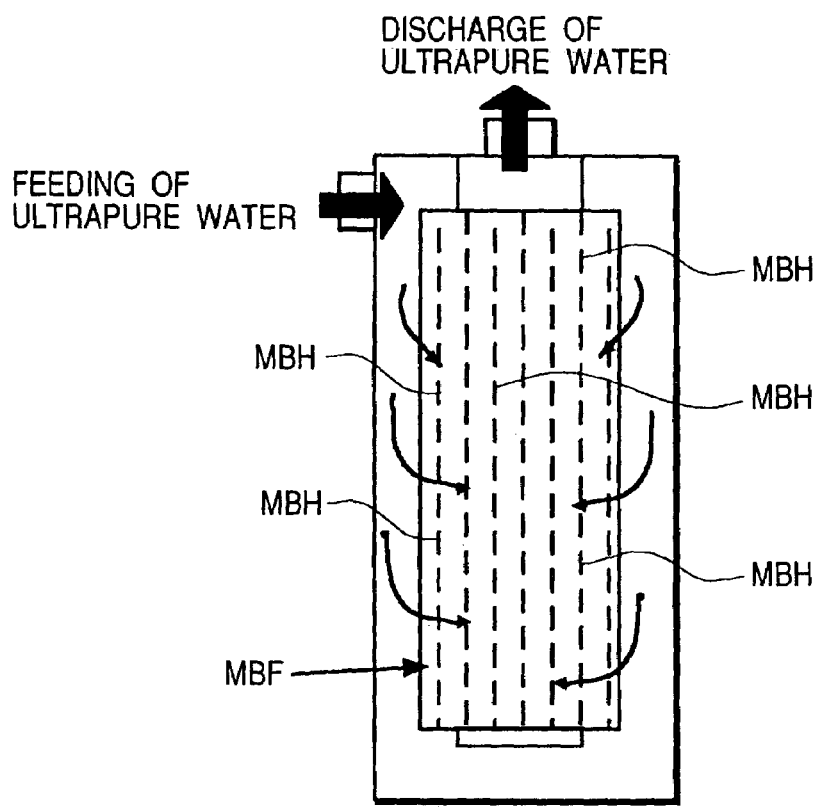
FIG. 9 is a schematic diagram of an ion filter to be disposed downstream of the UF equipment included in the system for preparing ultrapure water to be used for the fabrication of the semiconductor integrated circuit device according to the one embodiment of the present invention.
Figure 10:
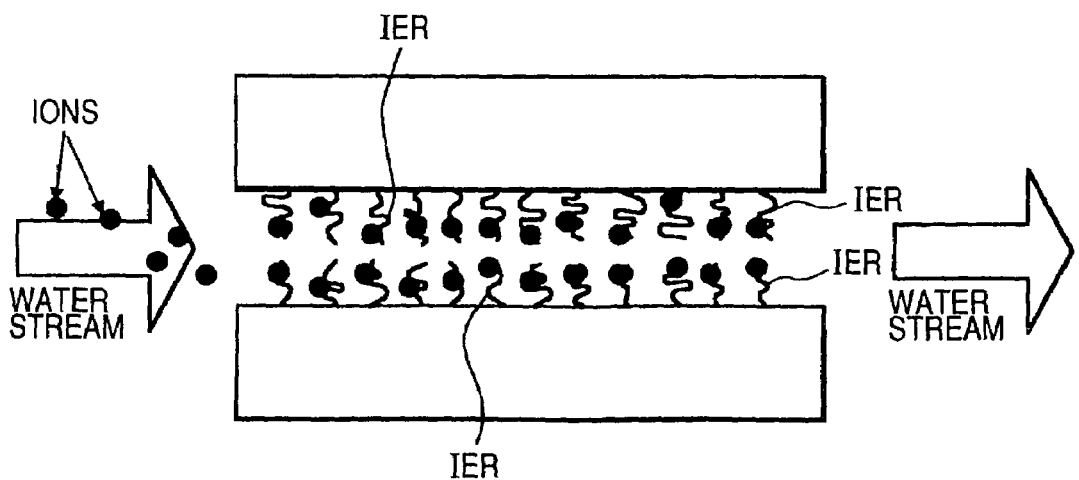
FIG. 10 is a fragmentary cross-sectional view illustrating how ions are trapped by the ion filter illustrated in FIG. 9.

Downstream of the UF equipment UFE (refer to FIGS. 4 and 5), an ion filter (first filter), having a membrane film MBF in a circular sheet form, may be disposed as illustrated in FIG. 9. The ultrapure water passing through the UF equipment UFE is supplied to its ion filter and then, enters into the membrane film MBF from a membrane hole MBH of the membrane film MBF. As illustrated in FIG. 10, an ion exchange radical IER has been formed in the membrane hole MBH. Ions in the ultrapure water are adsorbed to this ion exchange radical IER and thus can be removed. In other words, even if a plurality of hollow fiber membranes TYM disposed in the UF module of the UF equipment UFE (refer to FIGS. 4 and 5) are bonded to each other at end portions thereof by an amine-containing adhesive (for example, an epoxy resin) and the ionized amine is discharged together with ultrapure water, it can be removed from the ultrapure water by causing the water to pass through the above-described ion filter.

As illustrated in FIG. 11, it is possible to omit the anion removing filter AED3 and mixed ion removing filter MED from the ultrapure preparing system of this Embodiment, as illustrated in FIGS. 4 and 5, and to dispose an ion filter, as illustrated in FIG. 9, downstream of the UF equipment. In FIG. 11, the heat exchanger HEXS is not illustrated. When the system does not include these filters, an ion filter IFA having an ion exchange radical capable of adsorbing thereto anions and an ion filter IFC having an ion exchange radical capable of adsorbing thereto cations are disposed as the ion filter. Without using the anion removing filter AED3 and mixed ion removing filter MED, anions and cations can be removed from the primary pure water by the ion filter IFA and ion filter IFC. Moreover, even when the ionized amine runs off from the UF module, it can be removed by the ion filters IFA and IFC. In such a ultrapure water preparing system of this Embodiment, the anion removing filter AED3 and mixed ion removing filter MED can be omitted, which contributes to simplification of this system. This makes it possible to facilitate the maintenance of the ultrapure water preparing system of this Embodiment.

As illustrated in FIG. 12, the anion removing filter AED3 and mixed ion removing filter MED in the ultrapure water preparing system of this Embodiment, as illustrated in FIGS. 4 and 5, may be replaced with the above-described ion filter (second filter) IFA and ion filter (second filter) IFC. In FIG. 12, the heat exchanger HEXC is not illustrated. Since the ion exchange resin constituting the anion removing filter AED3 and mixed ion removing filter MED contains an amine, there is a possibility of ionized amine leaking from the anion removing filter AED3 and mixed ion removing filter MED when primary pure water is caused to pass through these filters. The test made by the present inventors has revealed that ionized amine is leaked from the anion removing filter AED3 and mixed ion removing filter MED, and the leakage amount from the anion removing filter AED3 is greater. It is therefore possible to be free from an inconvenience, such as caused by a leakage of ionized amine, when the anion removing filter AED3 and mixed ion removing filter MED are replaced with the ion filters IFA and IFC.

Figure 13:
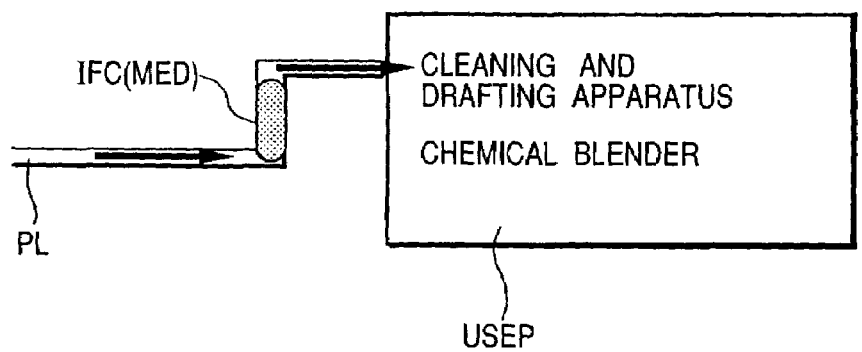
FIG. 13 is a diagram which illustrates another example of the ion filter illustrated in FIG. 9.

As illustrated in FIG. 13, the ion filter IFC may be installed in the pipe line (pathway) PL for delivering ultrapure water to the point of use USED from the UF equipment UFE. The point of use USEP embraces not only cleaning and drafting equipment (first wet treating equipment) to be used for the cleaning (first wet treatment) of the semiconductor substrate 1, but also chemical-solution preparing equipment (first wet treating equipment) in which a chemical solution, such as dilute hydrofluoric acid, is prepared using ultrapure water. Ionized amine is a cation so that installment of the ion filter IFC in the pipe line PL makes it possible to remove, by use of the filter IFC, ionized amine from ultrapure water to be fed to the point of use USEP, even if ionized amine flows out from the UF equipment UFE as a mixture in ultrapure water. In this Embodiment, the ion filter IFC is installed in the pipe line PL. Instead of the ion filter IFC, a mixed ion removing filter may be used for the removal of ionized amine from ultrapure water.

Figure 14:
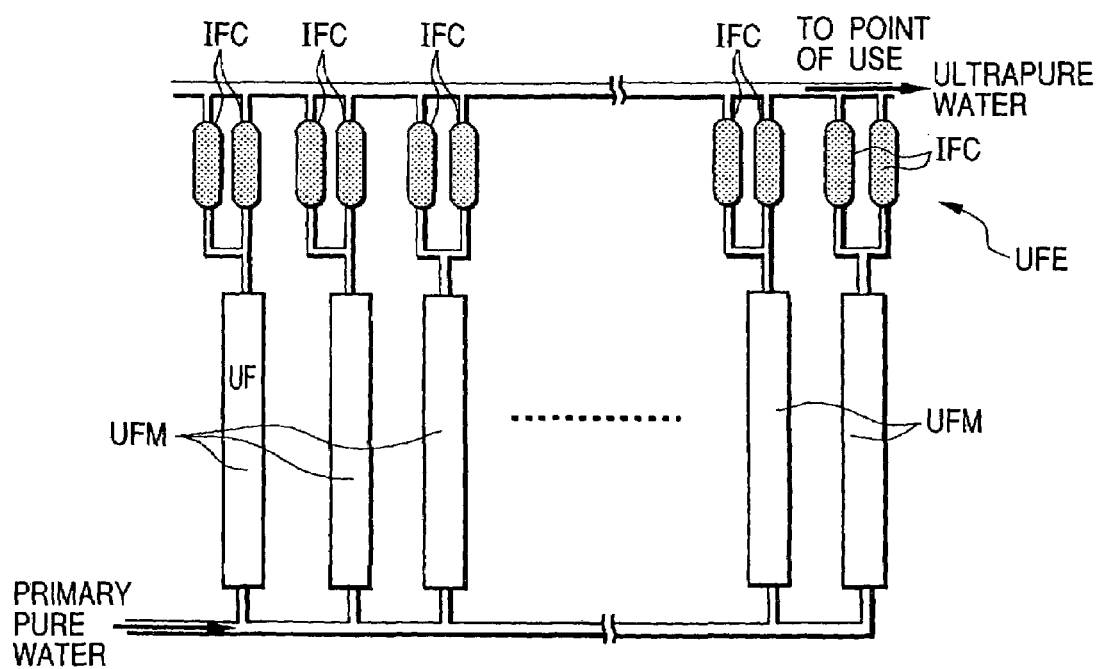
FIG. 14 is a diagram which illustrates a further example of the ion filter illustrated in FIG. 9.

The UF equipment UFE is made of a plurality of UF modules UFM, as illustrated in FIG. 14. Similar to the UF modules as described with reference to FIG. 6, these UF modules UFM have, disposed in the body thereof, a plurality of capillary hollow fiber membranes made of a polysulfone membrane or polyimide membrane. When the plurality of hollow fiber membranes are bundled using an amine-containing adhesive, ionized amine presumably comes to be mixed in ultrapure water discharged from the UF modules UFM. Therefore, in this Embodiment, the above-described ion filter IFC is disposed upstream of each of the UF modules UFM. This makes it possible to remove ionized amine by use of the ion filter IFC even if ionized amine is mixed in the ultrapure water discharged from the UF modules UFM. Upon disposal, the capacity for allowing the passage of water is set to be greater in the ion filter IFC than in the UF module UFM. When the ion filter IFC is inferior with regard to this capacity relative to the UF module UFM, a plurality of the ion filters IFC are disposed per UF module UFM, so that the total capacity of the plurality of ion filters IFC would exceed that of one UF module UFM.

Figure 15:
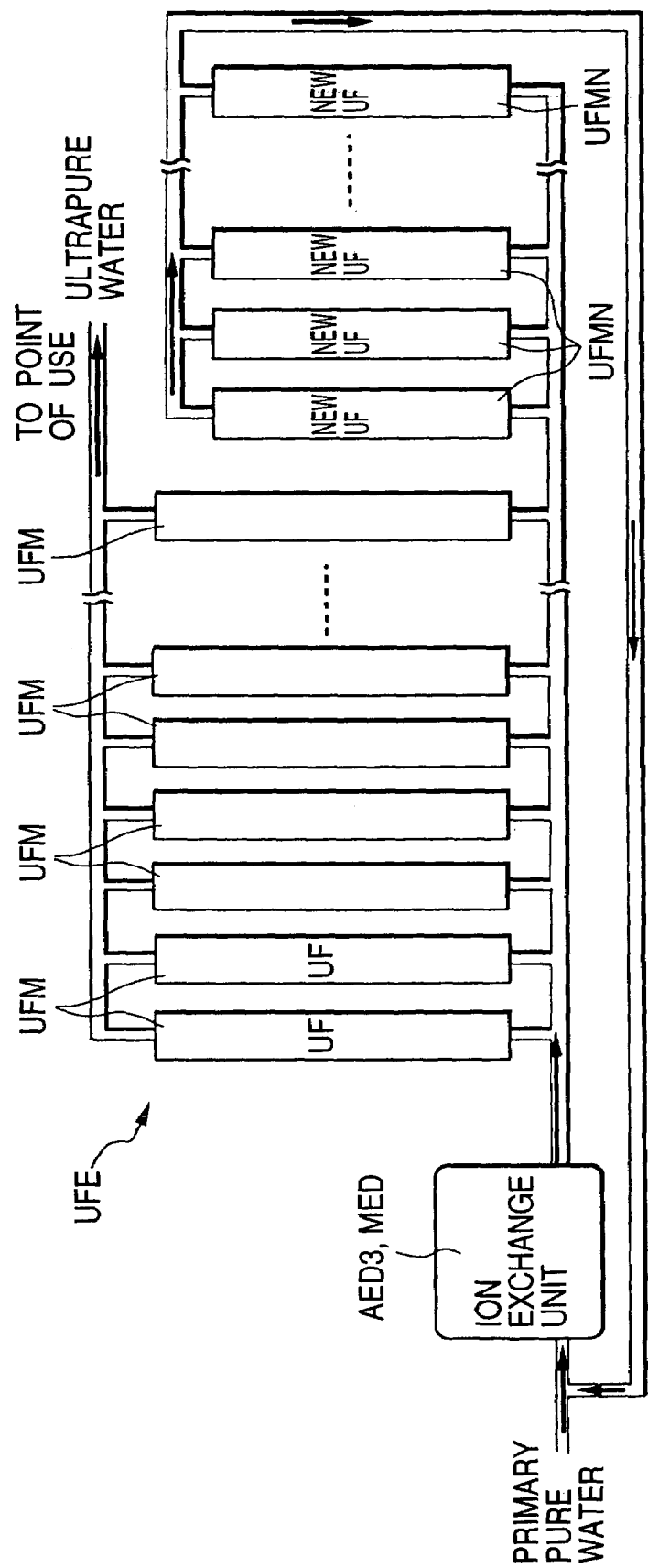
FIG. 15 is a schematic diagram illustrating the constitution of the UF equipment included in the system for preparing ultrapure water to be used for the fabrication of the semiconductor integrated circuit device according to the one embodiment of the present invention.
Figure 16:
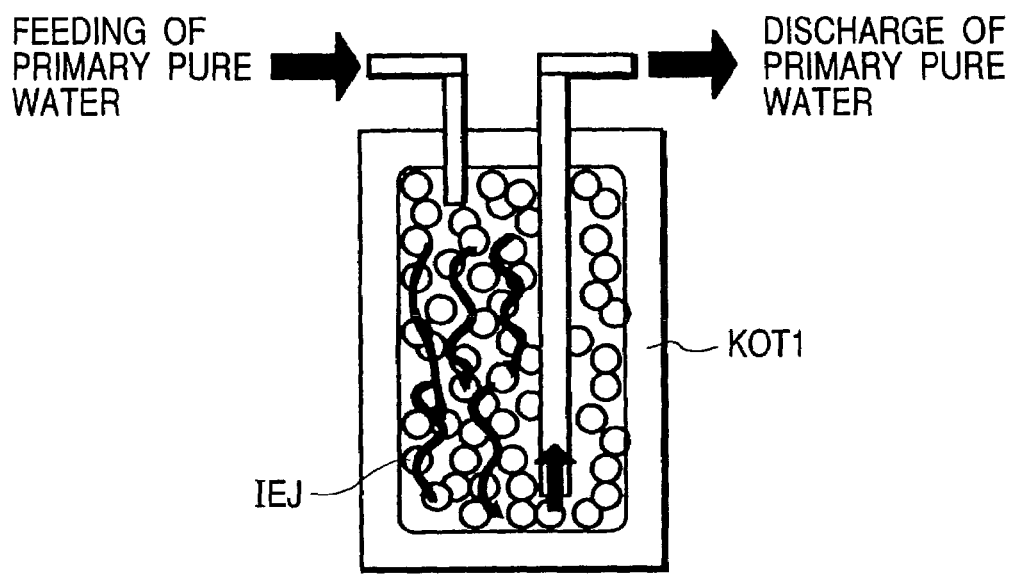
FIG. 16 is a schematic diagram for illustrating an anion deminer and a cation deminer included in the system for preparing ultrapure water to be used for the fabrication of the semiconductor integrated circuit device according to the one embodiment of the present invention.
Figure 17:
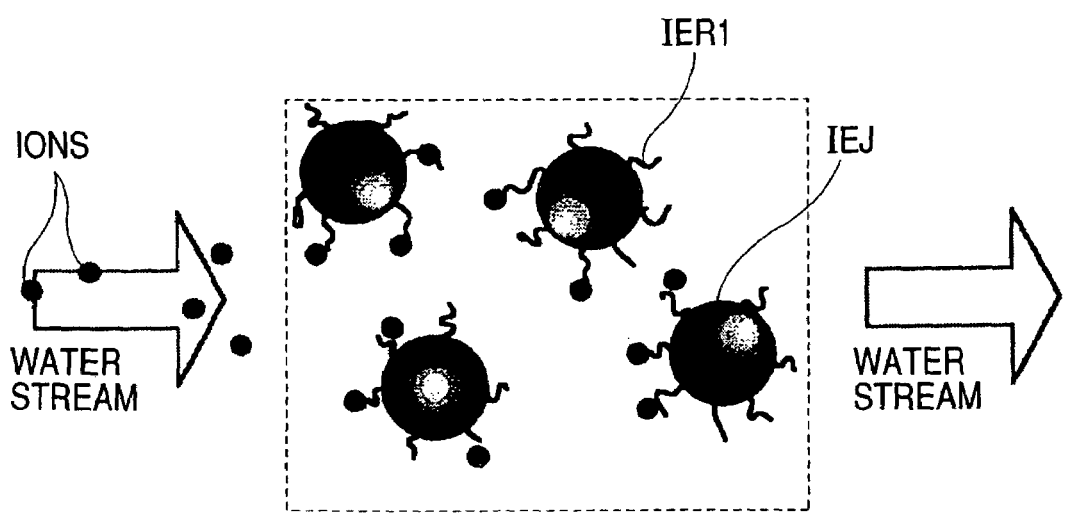
FIG. 17 is a schematic diagram illustrating ion adsorption by an ion exchange resin as shown in FIG. 16.

When a plurality of hollow fiber membranes are bundled by an amine-containing adhesive, as in the above-described UF modules UFM, the amount of ionized amine is small relative to the whole amine amount. Of the whole amine amount, only ionized amine is hydrophilized and flows out from the UF modules UFM, passing through the hollow fiber membranes. Most of the amine existing in the ionized form is discharged from the UF modules together with ultrapure water after an elapse of a predetermined term after disposal of new UF modules in the UF equipment UFE, which term varies depending on the amount of water caused to pass through the UF modules. An area for installing new UF modules UFMN is established in the UF equipment UFE, as illustrated in FIG. 15. To new UF modules UFMN installed in this area, as well as to the other UF modules UFM, primary pure water, which has passed through the anion removing filter AED3 and mixed ion removing filter MED, is fed. The primary pure water that is fed to the new UF modules UFMN is discharged from the new UF modules UFMN as ultrapure water containing ionized amine existing In the new UF modules UFMN, it is fed to the upstream side of the anion removing filter AED3 and mixed ion removing filter MED, and then it unites with the primary pure water upstream thereof. The ultrapure water, together with the primary pure water, is then fed to the anion removing filter AED3 and mixed ion removing filter MED. The anion removing filter AED3 and mixed ion removing filter MED used here each has, in the body KOT1 thereof, a plurality of ion exchange resins IEJ disposed as illustrated in FIG. 16. As illustrated in FIG. 17, the ion exchange resins IEF each has an ion exchange radical IER1, which adsorbs thereto ions in the primary pure water fed to the body KOT1. Ionized amine contained in the ultrapure water is a cation so that it can be adsorbed to and removed by the mixed ion removing filter MED. The ultrapure water from which ionized amine has been removed is fed again to the UF equipment UFE together with the primary pure water. The above-described steps are then repeated. By these steps, new UF modules UFMN can be cleaned to remove the ionized amine existing therein, whereby primary pure water which is used for the removal of ionized amine can be provided for recycling use without being discarded. The test made by the present inventors has revealed that, when a column having a diameter of about 106 mm and a height of 1150 mm was used as a new UF module UFMN, run-off of ionized amine from the new UF module UFMN stopped about two or three months (preferably about 3 months) after about 3 $m^3$ per hour of the primary pure water was caused to pass through the new UF module UFMN. Such a new UF module UFMN, which becomes free from leakage of ionized amine after such a step, can be used as a substitute for an old UF module UFM. The number of such new UF modules UFMN to be disposed of must be equal or greater than that of the UF modules which are worn and need replacement. The number of new modules can be set freely depending on whether the old UF modules UFM are replaced wholly or partially.

Alternatively, new UF modules UFMN, as described above, may be installed in a pathway (refer to FIGS. 4 and 5) for returning, to an intermediate storage tank MIDT, a nonused portion of ultrapure water at the point of use USEP. Ultrapure water fed to the new UF module UFMN is discharged therefrom as ultrapure water containing the ionized amine existing in the new UF module UFMN. This ionized-amine-containing ultrapure water is sent to the intermediate storage tank MIDT (refer to FIGS. 4 and 5), and there it unites with primary pure water. The ionized amine can be removed when the primary pure water passes through the mixed ion removing filter MED (refer to FIGS. 4 and 5). The ultrapure water from which ionized amine has been removed is fed again to the UF equipment UFE together with the primary water. The above-described steps are then repeated. By such steps, ionized amine existing in the new UF module UFMN can be removed. Moreover, ultrapure water used for the removal of ionized amine can be provided for recycling without being discarded.

As described above, the ion exchange resin IEJ (refer to FIGS. 16 and 17) constituting the anion removing filter AED3 and mixed ion removing filter MED contains an amine. The amine in the ion exchange resin does not contain so much Ionized amine. As in the UF module UFM, the ionized amine is hydrophilized and inevitably flows out from the anion removing filter AED3 and mixed ion removing filter MED. It is therefore possible to remove ionized amine contained in the ion exchange resin IEJ by disposing new anion removing filters AED3 and mixed ion removing filters MED in an area similar to the area in which the new UF modules UFMN are disposed. The ionized amine contained in the Ion exchange resin IEJ may be removed, as in the case of the new UF modules UFMN, by disposing new anion removing filters AED3 and mixed ion removing filters MED in a pathway (refer to FIGS. 4 and 5) for returning a nonused portion of the ultrapure water at the point of use USEP to an intermediate storage tank MIDT.

Figure 18:
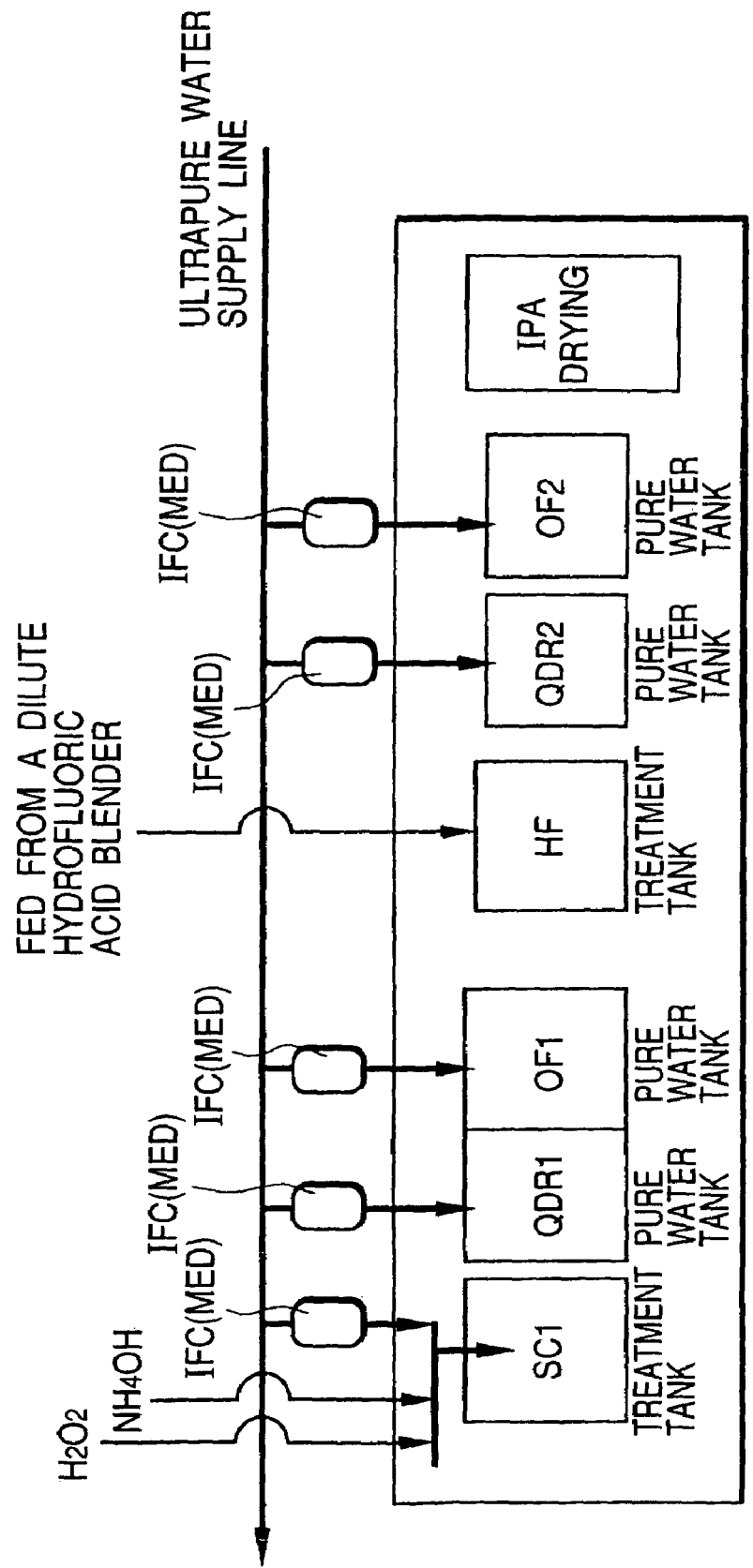
FIG. 18 is a schematic diagram of one example of a cleaning and drafting apparatus to be used for the fabrication of the semiconductor integrated circuit device according to the one embodiment of the present invention.

When the ultrapure water prepared through the above-described steps is used in a cleaning step of the semiconductor substrate 1, from which a silicon nitride film used for the formation of the above-described field insulating film 6 (refer to FIG. 3) has been removed, a cleaning and drafting apparatus, as illustrated in FIG. 18, can be used. The ultrapure water prepared by the ultrapure water preparing system of this Embodiment, which has been described with reference to FIGS. 4 to 17, is fed to each of a treatment tank SC1 and pure water tanks QDR1, QDR2, OF1 and OF2, which are points of use USED of ultrapure water (refer to FIGS. 4 and 5). As described above with reference to FIG. 13, an ion filter IFC having an ion exchange radical capable of adsorbing thereto cations or a mixed ion removing filter MED may be installed in respective pipe lines for feeding ultrapure water to the treatment tank SC1 and pure water tanks QDR1, QDR2, OF1 and OF2. The treatment tank SC1 is fed with $H_2O_2$ and $NH_4OH$, while the treatment tank HF is fed with dilute hydrofluoric acid prepared using the ultrapure water of this Embodiment. The semiconductor substrate 1 is cleaned, as described below, by such a cleaning and drafting apparatus. First, cleaning with $NH_4OH/H_2O_2/H_2O$ is conducted in the treatment tank SC1, followed by cleaning with ultrapure water in the pure water tanks QDR1 and OF1. After cleaning with dilute hydrofluoric acid in the treatment tank HF, cleaning with pure water is conducted in the pure water tanks QDR2 and OF2. The semiconductor substrate 1 is then dried by IPA (isopropyl alcohol) vapor drying method, by which the step of cleaning the semiconductor substrate 1 using the cleaning and drafting apparatus illustrated in FIG. 18 is completed. When the cleaning and drafting apparatus as illustrated in FIG. 18 is applied to another cleaning step, which does not need the treatment in the treatment tank SC1 and pure water tanks QDR1 and OF1, the cleaning step may be started from the treatment in the treatment tank HF.

Figure 19:
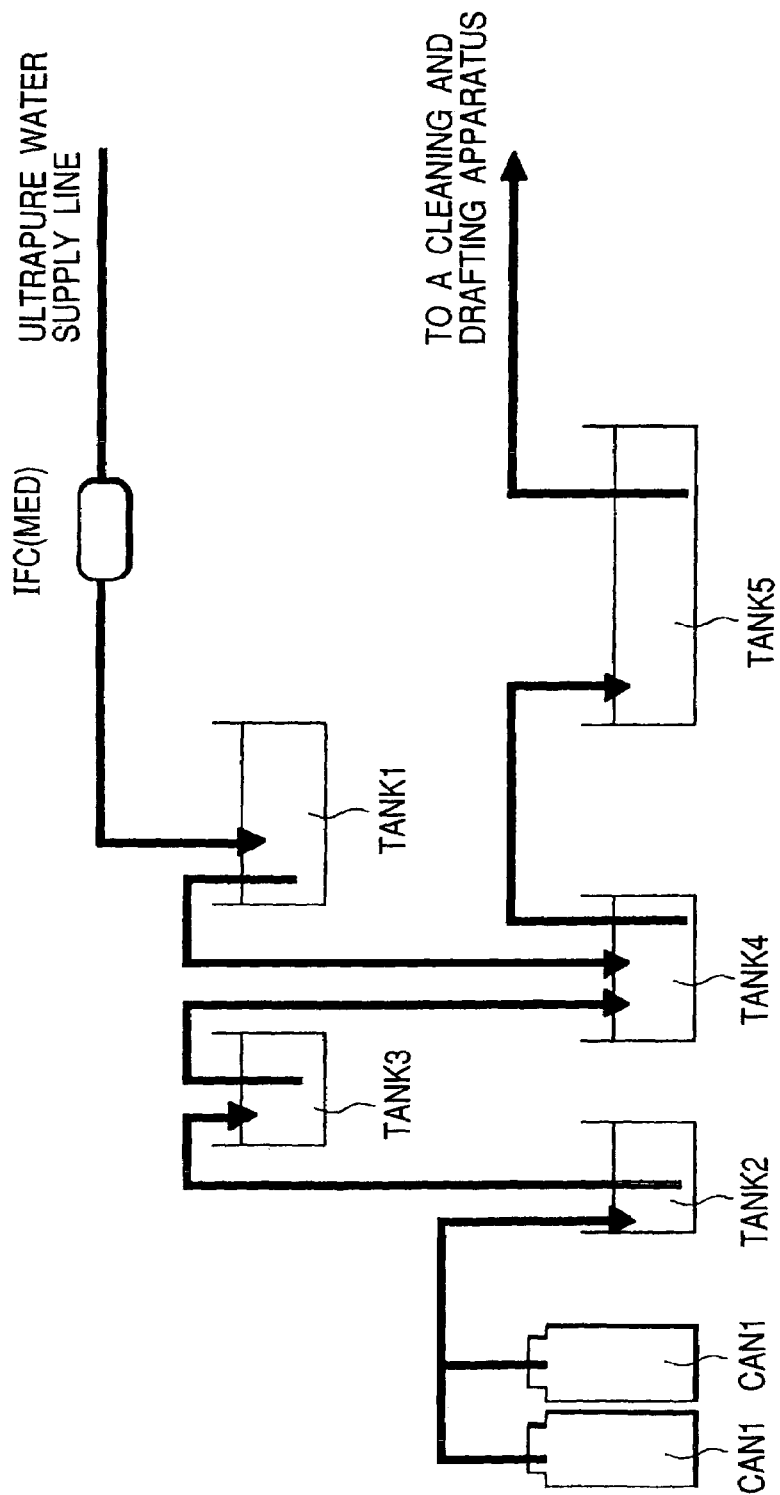
FIG. 19 is a schematic diagram of a dilute hydrofluoric acid preparing apparatus for preparing dilute hydrofluoric acid to be fed to the cleaning and drafting apparatus shown in FIG. 18.

FIG. 19 is a schematic view of a dilute hydrofluoric acid preparing apparatus. This dilute hydrofluoric acid preparing apparatus is one of the points of use USEP of ultrapure water (refer to FIGS. 4 and 5). The ultrapure water prepared by the ultrapure water preparing system of this Embodiment, as described with reference to FIGS. 4 to 17, is first fed in a predetermined amount to a pure water weighing tank TANK 1. As described above with reference to FIG. 13, an ion filter IFC having an ion exchange radical capable of adsorbing thereto cations or a mixed ion removing filter MED is installed in the pipe line for feeding ultrapure water to the pure water weighing tank TANK 1. Undiluted hydrofluoric acid fed from a hydrofluoric acid canister CAN1 to an undiluted hydrofluoric acid tank TANK 2 is weighed by being transferred from the undiluted hydrofluoric acid tank TANK2 to a hydrofluoric acid weighing tank TANK 3. From the pure water weighting tank TANK 1 and the hydrofluoric acid weighing tank TANK 3, ultrapure water and undiluted hydrofluoric acid are then fed respectively to a blending tank TANK4, in which ultrapure water and the undiluted hydrofluoric acid are blended at a predetermined ratio to prepare dilute hydrofluoric acid. In this Embodiment, an example consists of an about 1:99 or 1:19 mixture of undiluted hydrofluoric acid and ultrapure water. The dilute hydrofluoric acid is then transferred from the blending tank TANK4 to a feeding tank TANK5, whereby it can be provided for a cleaning and drafting apparatus.

Figure 20:
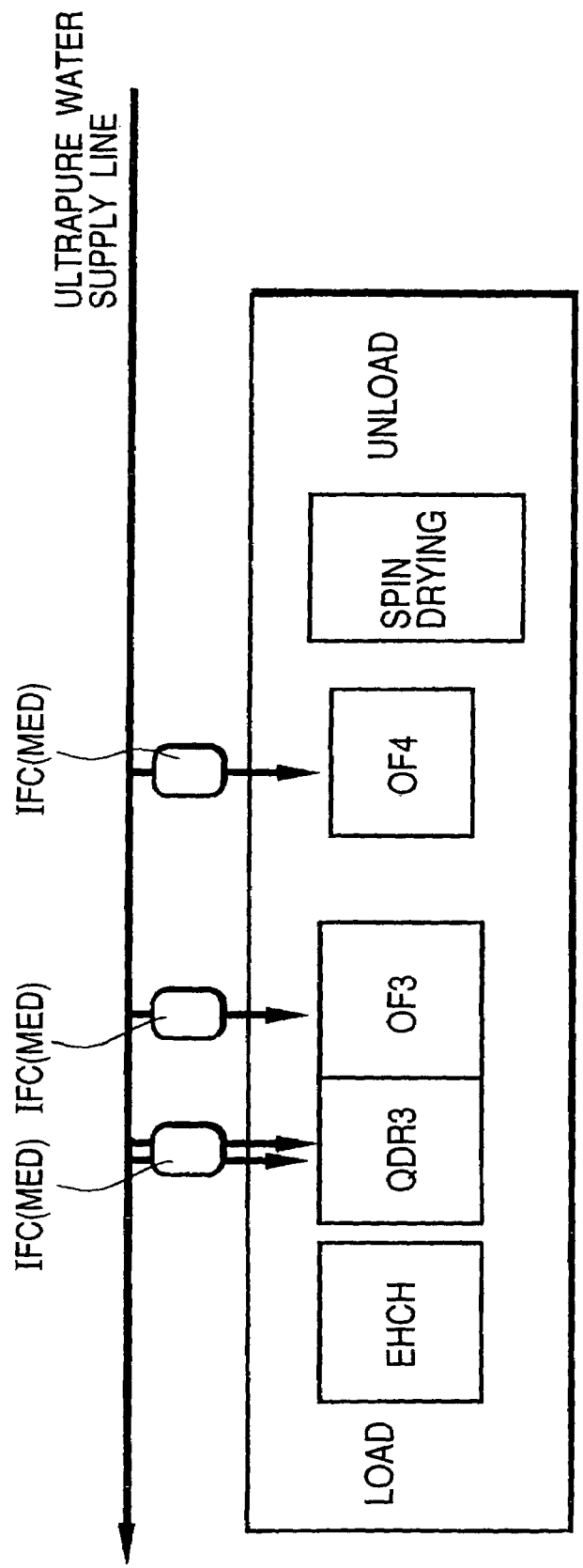
FIG. 20 is a schematic diagram of one example of a wet etching apparatus to be used for the fabrication of the semiconductor integrated circuit device according to the one embodiment of the present invention.

After removal of the silicon nitride film used for the formation of the field insulating film 6 (refer to FIG. 3) and cleaning of the semiconductor substrate 1, the surface thereof is oxidized to form thereover a gate insulating film 8 having a film thickness of about 20 nm. By wet etching with a photoresist film (not illustrated) patterned by photolithography, the gate insulating film 9 in a region 1C is selectively removed. In this Embodiment, wet etching can be carried out by a wet etching apparatus (refer to FIG. 20) which uses ultrapure water prepared by the ultrapure water preparing system of this Embodiment, as described above with reference to FIGS. 4 to 17. The ultrapure water is fed to each of the pure water tanks QDR3, OF3 and OF4, which are points of use USEP (refer to FIGS. 4 and 5) of the ultrapure water. As described above with reference to FIG. 13, an ion filter IFC having an ion exchange radical capable of adsorbing thereto cations or a mixed ion removing filter MED may be installed in each of the pipe lines for feeding the pure water tanks QDR3, OF3 and OF4 with ultrapure water. An etching tank ETCH contains an etching solution for etching of the silicon oxide film. In such a wet etching step of the gate insulating film 8 by the wet etching apparatus, the gate insulating film 8 is wet etched by immersing the semiconductor substrate 1 in the etching tank ETCH. After cleaning the semiconductor substrate 1 using ultrapure water in the pure water tanks OF3 and OF4, the semiconductor substrate 1 is dried by spin drying, whereby the wet etching step of the gate insulating film 8 performed by the wet etching apparatus illustrated in FIG. 20 is completed.

Figure 21:
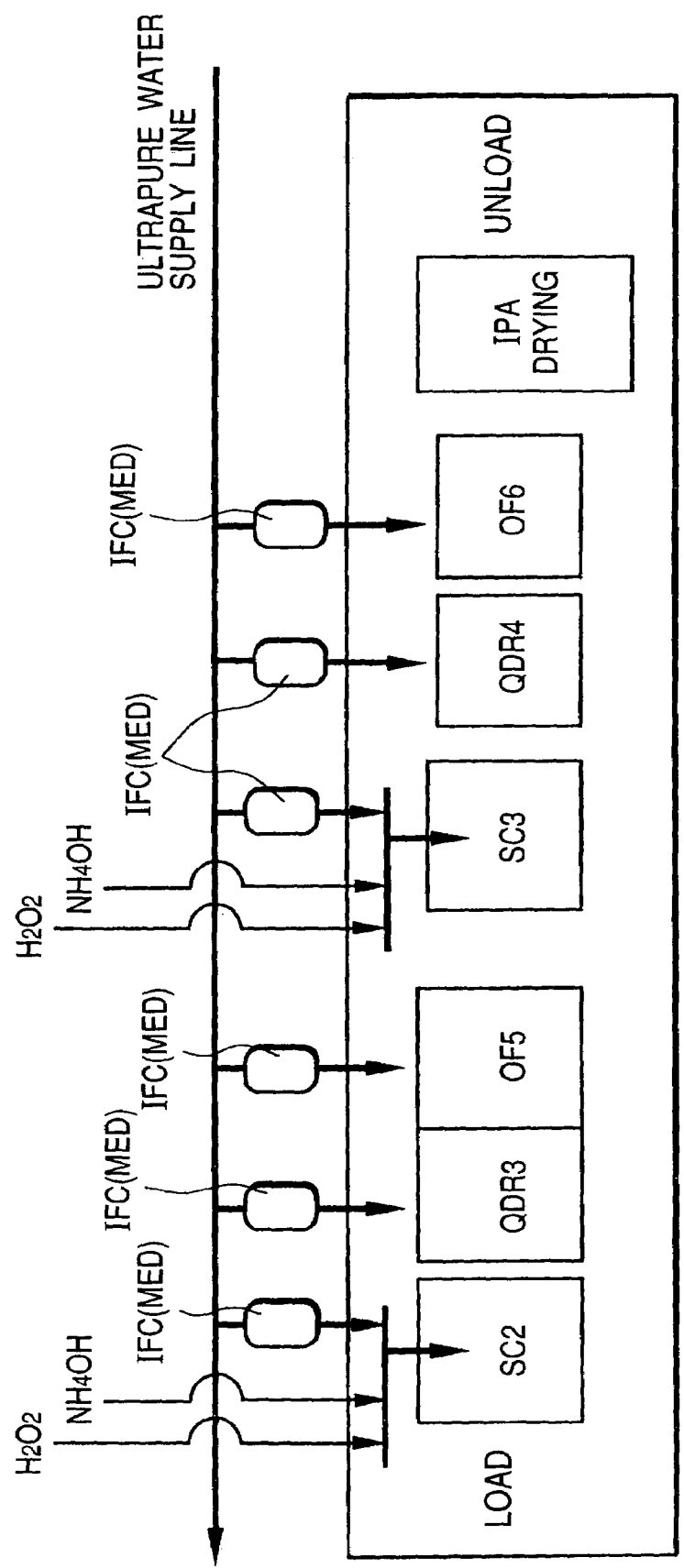
FIG. 21 is a schematic diagram of one example of a cleaning and drafting apparatus to be used for the fabrication of the semiconductor integrated circuit device according to the one embodiment of the present invention.

After removal of the photoresist film, the semiconductor substrate 1 is cleaned, for example, by a cleaning and drafting apparatus, as illustrated in FIG. 21. The ultrapure water prepared by the ultrapure water preparing system of this Embodiment, as described with reference to FIGS. 4 to 17, is fed to each of the treatment tanks SC2 and SC3, and the pure water tanks QDR3, QDR4, OF5 and OF6 which are each a point of use USEP of the ultrapure water (refer to FIGS. 4 and 5). As described above with reference to FIG. 13, an ion filter IFC having an ion exchange radical capable of adsorbing thereto cations or a mixed ion removing filter MED may be installed in respective pipe lines for feeding the treatment tanks SC2 and SC3, and pure water tanks QDR3, QDR4, OF5 and OF6. The treatment tank SC2 is fed with $H_2O_2$ and $NH_4OH$, while the treatment tank SC3 is fed with $H_2O_2$ and HCl (hydrochloric acid). Cleaning of the semiconductor substrate 1 by such a cleaning and drafting apparatus is carried out in the following manner. First, cleaning with $NH_4OH/H_2O_2/H_2O$ is conducted in the treatment tank SC2, followed by cleaning with the ultrapure water in the pure water tanks QDR3 and OF5. After cleaning with $HCl/H_2O_2/H_2O$ in the treatment tank SC3, cleaning with ultrapure water is conducted in the pure water tanks QDR4 and OF6. The semiconductor substrate 1 is dried by use of an IPA vapor drying method, whereby the cleaning of the semiconductor substrate 1 by the cleaning and drafting apparatus as illustrated in FIG. 21 is completed.

Figure 22:
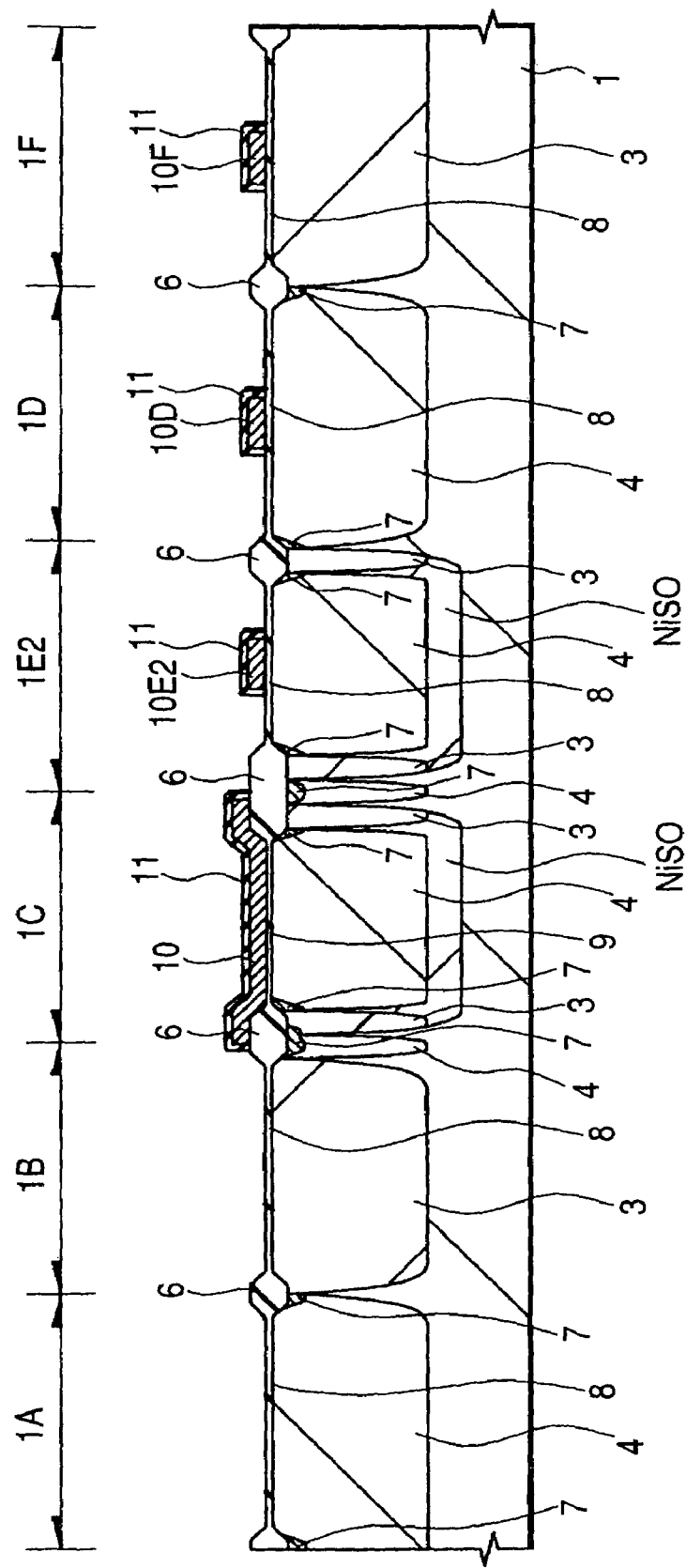
FIG. 22 is a fragmentary cross-sectional view of the semiconductor integrated circuit device during the fabrication step following the step of FIG. 3.

As illustrated in FIG. 22, the surface of the semiconductor substrate 1 is oxidized to form a gate insulating film (tunnel oxide film) 9 having a film thickness of about 10 nm over the surface of the p type well 4 in a region 1C. The gate insulating film 9 may have a film thickness not greater than 10 nm, for example, about 5 nm.

By CVD, a polycrystalline Si film (first conductive film) 10 of about 200 nm thick is deposited over the main surface (device surface) of the semiconductor substrate 1. This polycrystalline Si film 10 may be formed by depositing amorphous Si over the semiconductor substrate 1 by CVD and then heat treating this amorphous Si to convert amorphous Si to polycrystalline Si.

After deposition of a phosphate glass film (not illustrated) over the surface of the polycrystalline Si film 10, for example, by the coating method, the semiconductor substrate 1 is heat treated to introduce P into the polycrystalline Si film 10. After removal of the phosphate glass film, the polycrystalline Si film 10 is patterned by photolithography using a photoresist film (not illustrated) as a mask. This makes it possible to leave the polycrystalline Si film 10 in the region 1C, and to form gate electrodes 10D, 10E2 and 10F in the regions 1D, 1E2 and 1F, respectively. After removal of the photoresist film that was used for patterning of the polycrystalline Si film 10, heat treatment at about 950° C. is conducted to form a silicon oxide film (first insulating film) 11 over the surface of the polycrystalline Si film 10 (including gate electrodes 10D, 10E2 and 10F).

Figure 23:
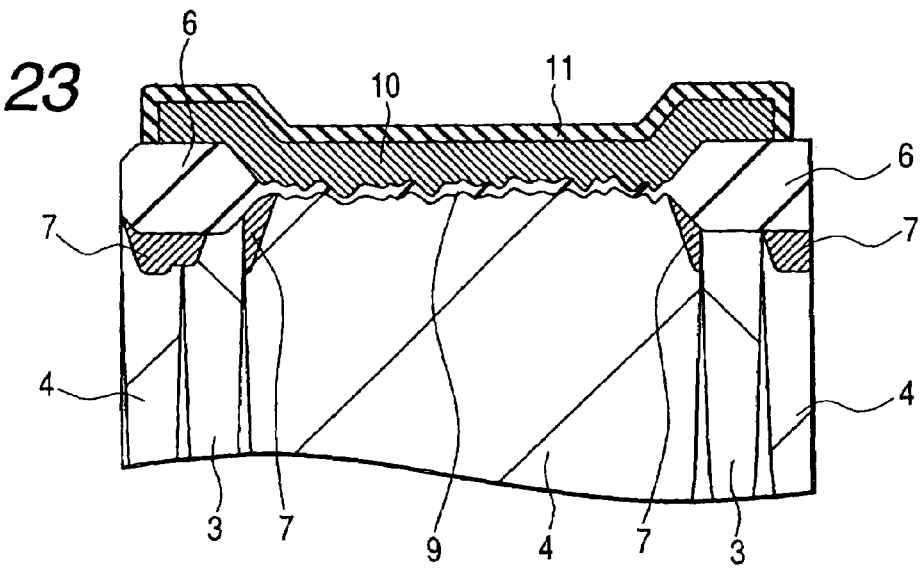
FIG. 23 is a fragmentary cross-sectional view illustrating the shape of the interface between the semiconductor substrate and the gate insulating film formed thereover after cleaning with ultrapure water having ionized amines mixed therein.
Figure 24:
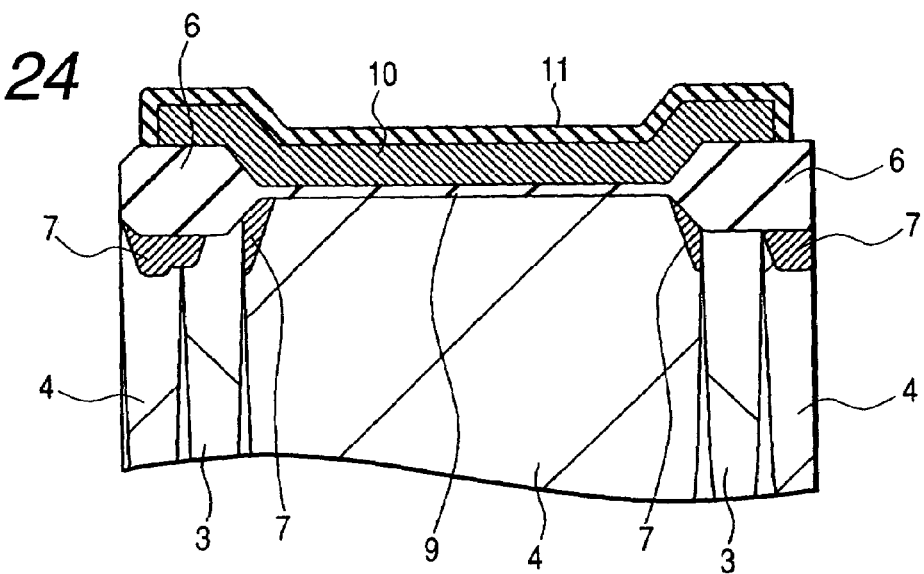
FIG. 24 is a fragmentary cross-sectional view illustrating the shape of the interface between the semiconductor substrate and the gate insulating film formed thereover after cleaning with ultrapure water free of ionized amines.

In the cleaning of the semiconductor substrate 1 with ultrapure water, the ultrapure water, if it contains ionized amine, inevitably etches the Si constituting the semiconductor substrate 1. As illustrated in FIG. 23, which is an enlarged view of the region 1C, the interface between the gate insulating film 9 and the semiconductor substrate 1 (p type well 4) becomes uneven. This unevenness adversely affects the shape of a thin film formed over the gate insulating film 9 and the interface between the gate insulating film 9, and polycrystalline Si film 10 or the interface between the polycrystalline Si film 10 and silicon oxide film 11 sometimes becomes uneven.

By using the ultrapure water preparing system of this Embodiment, as described with reference to FIGS. 4 to 17, inclusion of ionized amine in the ultrapure water can be prevented. Therefore, use of the ultrapure water prepared according to this Embodiment can prevent the formation of unevenness on the interface between the gate insulating film 9 and semiconductor substrate 1 (p type well 4) (refer to FIG. 24). This makes it possible to prevent a lowering of the breakdown voltage of the gate insulating film so that when a MISFET, which will constitute a memory cell of a flash memory is formed in the region 1C, deterioration in the write characteristics to the memory cell and the erase characteristics can be prevented.

Figure 25:
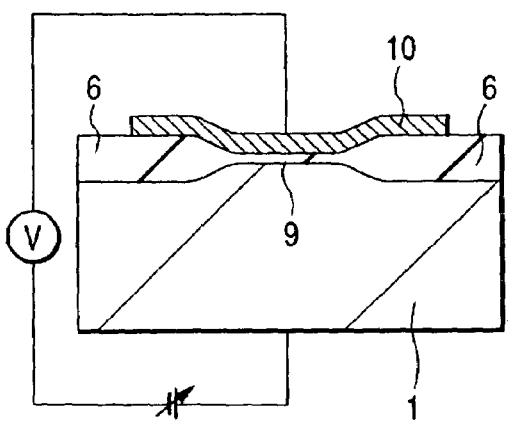
FIG. 25 is a schematic diagram illustrating a method of measuring the breakdown voltage of the gate insulating film of MISFET of the semiconductor integrated circuit device according to the one embodiment of the present invention.

The present inventors measured the breakdown voltage of the gate insulating film 9 in a manner as shown in FIG. 25. More specifically, the applied voltage, when an electric current of about $1 \times 10^{-11}$ is sent between the semiconductor substrate 1 and polycrystalline Si film 10, was measured by a probe. In FIG. 25, members other than the semiconductor substrate 1, field insulating film 6, gate insulating film 9 and polycrystalline Si film 10 are omitted. FIGS. 26 to 30 show the results of measurement of the breakdown voltage of the gate insulating film 9 at plural sites on the whole surface of the semiconductor wafer (semiconductor substrate 1). The gate insulating films 9 at sites showing a voltage less than 8V are regarded as defective because of a decline in breakdown voltage.

Figure 26:
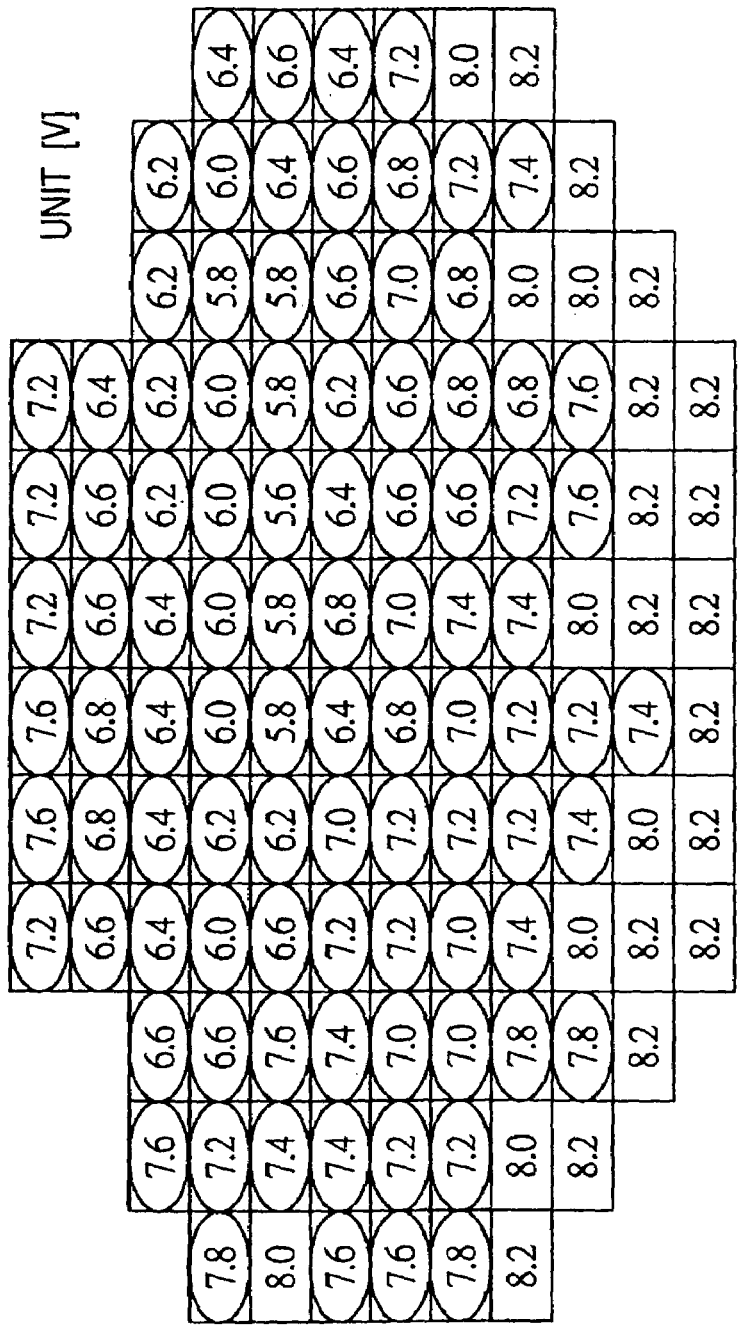
FIG. 26 is a schematic diagram illustrating the results of measurement of the breakdown voltage of the gate insulating film when the semiconductor substrate is cleaned with ultrapure water prepared just after replacement of the UF of the UF equipment with a new one.

FIG. 26 shows the results of measurement of the breakdown voltage of the gate insulating film 9 that is formed after cleaning the semiconductor substrate 1 with the ultrapure water which has been prepared just after replacement of the UF modules UFM (refer to FIG. 14) of the UF equipment UFE with new ones. In FIG. 26, results are shown for the case where the UF equipment is not equipped with the ion filter IFC illustrated in FIG. 14. As described above with reference to FIG. 14, the UF modules UFM each has, in the body thereof, a plurality of hollow fiber membranes bundled with an amine-containing adhesive. In a novel UF module UFM, a portion of an amine exists as ions. The ionized amine is hydrophilized and flows out from the UF module as a mixture with the ultrapure water. In the cleaning of the semiconductor substrate 1 with the ultrapure water, this ionized amine inevitably etches the Si constituting the semiconductor substrate 1, thereby forming an unevenness on the interface between the surface and the gate insulating film 9 formed thereover. It has been confirmed from the test results shown in FIG. 26 that this unevenness lowers the breakdown voltage of the gate insulating film 9.

FIG. 27 shows the results of measurement of the breakdown voltage of the gate insulating film 9 that is formed after cleaning the semiconductor substrate 1 with the ultrapure water which has prepared just after the replacement of the anion removing filter AED3 and mixed ion removing filter MED (refer to FIGS. 4 and 5) with new ones. Similar to the results shown in FIG. 26, FIG. 27 shows the results obtained in the case where the ion filter IFC illustrated in FIG. 14 is not installed. As described above with reference to FIG. 12, the ion exchange resin constituting the anion removing filter AED3 and mixed ion removing filter MED contains amines, so that when the primary water passes through these filters, ionized amine runs out from them. This ionized amine is hydrophilized and discharged from the UF equipment UFE as a mixture with the ultrapure water. Similar to the results shown in FIG. 26, this ionized amine inevitably etches the Si constituting the semiconductor substrate 1, thereby forming an unevenness on the interface between its surface and the gate insulating film 9 formed thereover. It has been confirmed from the test results shown in FIG. 27 that this unevenness lowers the breakdown voltage of the gate insulating film 9.

FIG. 28 shows the results of measurements of the breakdown voltage of the gate insulating film 9 that is formed after the cleaning of the semiconductor substrate 1 with ultrapure water prepared using the UF modules UFM of the UFE equipment UFE which have been used for a long time (for example, at least about 3 months). Similar to the results shown in FIG. 26 or FIG. 27, FIG. 28 shows results in the case where the ion filter IFC illustrated in FIG. 14 is not installed. As described above with reference to FIG. 15, most of the amines existing in ionized form are discharged, together with the ultrapure water, from the UF modules after an elapse of a predetermined term, which varies depending on the amount of water caused to pass through the UF modules UFM. There is no possibility of the ionized amine flowing out from the UF modules UFM if they have been used for a long time so that unevenness on the interface between the semiconductor substrate 1 and the gate insulating film 9, which will otherwise be formed as a result of etching, by the ionized amine, of the Si constituting the semiconductor substrate 1, does not occur. It can be confirmed also from the test results shown in FIG. 28 that the gate insulating film 9 is free from a reduction in the breakdown voltage because such an inconvenience is Inhibited.

FIG. 29 shows the results of measurements of the breakdown voltage of the gate insulating film 9 that is formed after cleaning the semiconductor substrate 1 (refer to FIG. 13) with the ultrapure water prepared by replacing the UF modules UFM with new ones and disposing a mixed ion removing filter MED downstream of the UF equipment UFE. In this case, the ionized amine flowing out from the new UF modules UFM can be removed by the mixed ion removing filter MED, so that unevenness on the interface between the semiconductor substrate 1 and the gate insulating film 9, which will otherwise be formed as a result of etching, by the ionized amine, of the Si constituting the semiconductor substrate 1, does not occur. It can be confirmed also from the test results shown in FIG. 29 that the gate insulating film 9 is free from a reduction in the breakdown voltage because such an inconvenience is inhibited.

FIG. 30 shows the results of measurement of the breakdown voltage of the gate insulating film 9 that is formed after cleaning the semiconductor substrate 1 (refer to FIG. 13) with the ultrapure water prepared by replacing the UF modules UFM with new ones and disposing an ion filter IFC (refer to FIG. 11) downstream of the UF equipment UFE. In this case, the ionized amine flowing out from the new UF modules UFM can be removed by the ion filter IFC so that unevenness on the interface between the semiconductor substrate 1 and the gate insulating film 9, which will otherwise be formed as a result of etching, by the ionized amine, of the Si constituting the semiconductor substrate 1, does not occur. It can be confirmed also from the test results shown in FIG. 30 that the gate insulating film 9 is free from a reduction in the breakdown voltage because such an inconvenience is inhibited.

FIG. 31 illustrates the relationship, classified by specification, between the amount of ionized amine attached to the semiconductor substrate 1 as a result of cleaning with ultrapure water and the existence or absence of a defective gate insulating film 9, as determined by the testing method illustrated in FIG. 25. At this time, the ultrapure water is fed to a cleaning and drafting apparatus (refer to FIG. 18) at a rate of 15 liter/minute. The cleaning step is started with the treatment in the treatment tank HF. After removal of the gate insulating film 8 that is formed in the region 1C to expose the Si constituting the semiconductor substrate 1, treatment is conducted in the pure water tanks QDR2 and OF2. Since the amount of ionized amine mixed in the ultrapure water was only a trace, the treatment time in the pure water tank OF2 was adjusted to about 100 minutes so that the amount of ionized amine attached to the semiconductor substrate 1 is clearly different among the specifications of the ultrapure water preparing system. The item indicated as "P test" shows the test results by the testing method (which will hereinafter be called a "probe test") illustrated in FIG. 25. Among the specifications of the ultrapure water preparing system to be tested, the specification indicated by "ReF" has UF modules UFM of the UF equipment UFE, which modules have been used for a long period of time (for example, about three months or greater). The specification indicated by "new UF" has new UF modules as the modules of the UF equipment UFE. The specification 1 indicates UF equipment UFE installed with new UF modules UFM after cleaning for about 2 weeks in a similar manner to that described above with reference to FIG. 15. The specification 2 indicates UF equipment UFE installed with new UF modules after cleaning for about 6 weeks in a similar manner to that described above with reference to FIG. 15. The specification 3 indicates UF equipment UFE which is installed with new UF modules and has a cation deminer and an anion deminer disposed downstream of the UF equipment UFE (between the UF equipment UFE and point of use USEP). The specification 4 indicates UF equipment UFE (FIG. 11), which is installed with new UF modules UFM and has an ion filter IFA and an ion filter IFC disposed downstream of the UF equipment UFE (between the UF equipment UFE and point of use USEP). As a result of comparison of the attached amount of ionized amine among these specifications, supposing that the attached amount of ionized amine in ReF is 100, the amount is greater in the new UF, Specification 1, Specification 2 and Specification 3 than in ReF. According to the results of the probe test, the new UF and specification 1 are judged to be defective. Although the specification 2 is judged to be defective as a result of the probe test, its defectiveness is lighter than that of the new UF or specification 1. From these results, the effectiveness of the ultrapure water preparing system of this Embodiment, characterized in that ionized amine is removed by the UF equipment and an ion exchange resin type ion removing filter (ion filter IFA and ion filter IFC) or deminer (cation removing filter and anion removing filter) disposed downstream of the UF equipment UFE (between the UF equipment and the point of use USEP) has been confirmed, along with the effectiveness of the use of new UF modules UFM, as illustrated in FIG. 15, after cleaning for a predetermined term.

Figure 32:
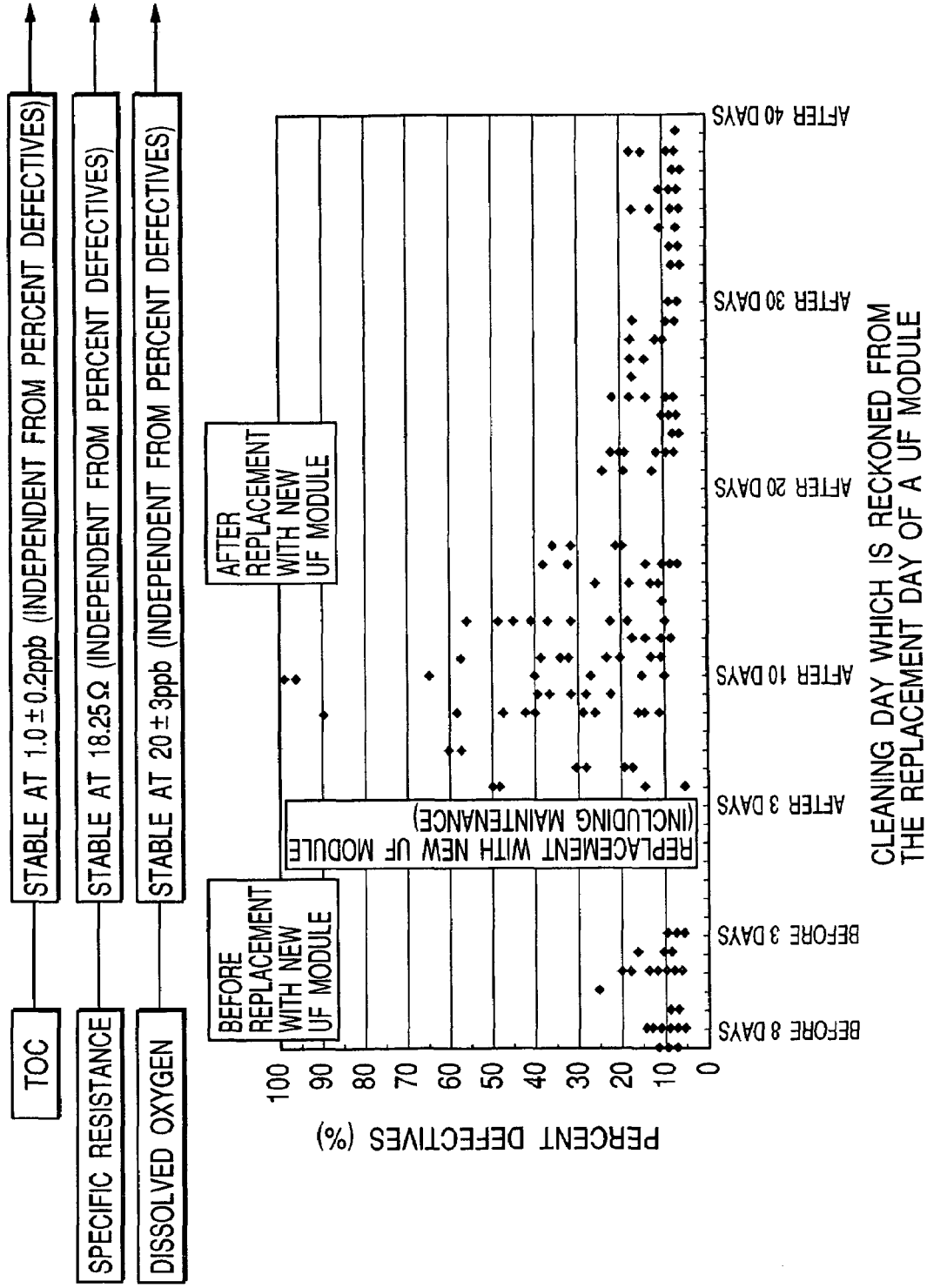
FIG. 32 is a schematic diagram illustrating the relationship between the cleaning date of the semiconductor substrate with ultrapure water and percent of defective gate insulating films.

FIG. 32 illustrates the relationship between the percent defectives of the gate insulating film 9 and the date on which the semiconductor substrate 1 was cleaned with ultrapure water reckoned from the date on which the UF modules UFM of the UF equipment UFE are replaced with new ones. At the time when mass production (cleaning step) of the flash memory of this Embodiment is started again after replacement of the UF modules UFM with new ones, a TOC content in the ultrapure water, its specific resistance and the concentration of dissolved oxygen in the ultrapure water have recovered their normal values, more specifically, approximately 1.0±0.2 ppb, 18.25 MΩ and 20±3.0 ppb, respectively. Although the mass production is restarted when this TOC content, specific resistance and concentration of dissolved oxygen become normal values, some gate insulating films 9 are defective, suggesting that these elements have no relationship with the percent of defective gate insulating films 9. The TOC content, specific resistance and dissolved oxygen concentration, each of the ultrapure water, become the above-described values for about 1.5 days, about 0.5 day and about 0.5 day after replacement of the UF modules UFM with the new ones, so that for about three days after replacement with the UF modules UFM with new ones, the cleaning step is not conducted even though ultrapure water is provided. The percent of defective gate insulating films 9 increases just after the day of replacement of the UF modules UFM with new ones, followed by a gradual decrease day by day. This occurs because, as the primary pure water passes through the new UF modules UFM, the ionized amine existing in the new UF modules UFM flows out and its amount decreases. From the above-described results, the effectiveness of the cleaning of new UF modules UFM for a predetermined term, as illustrated in FIG. 15, can be confirmed.

Figure 33:
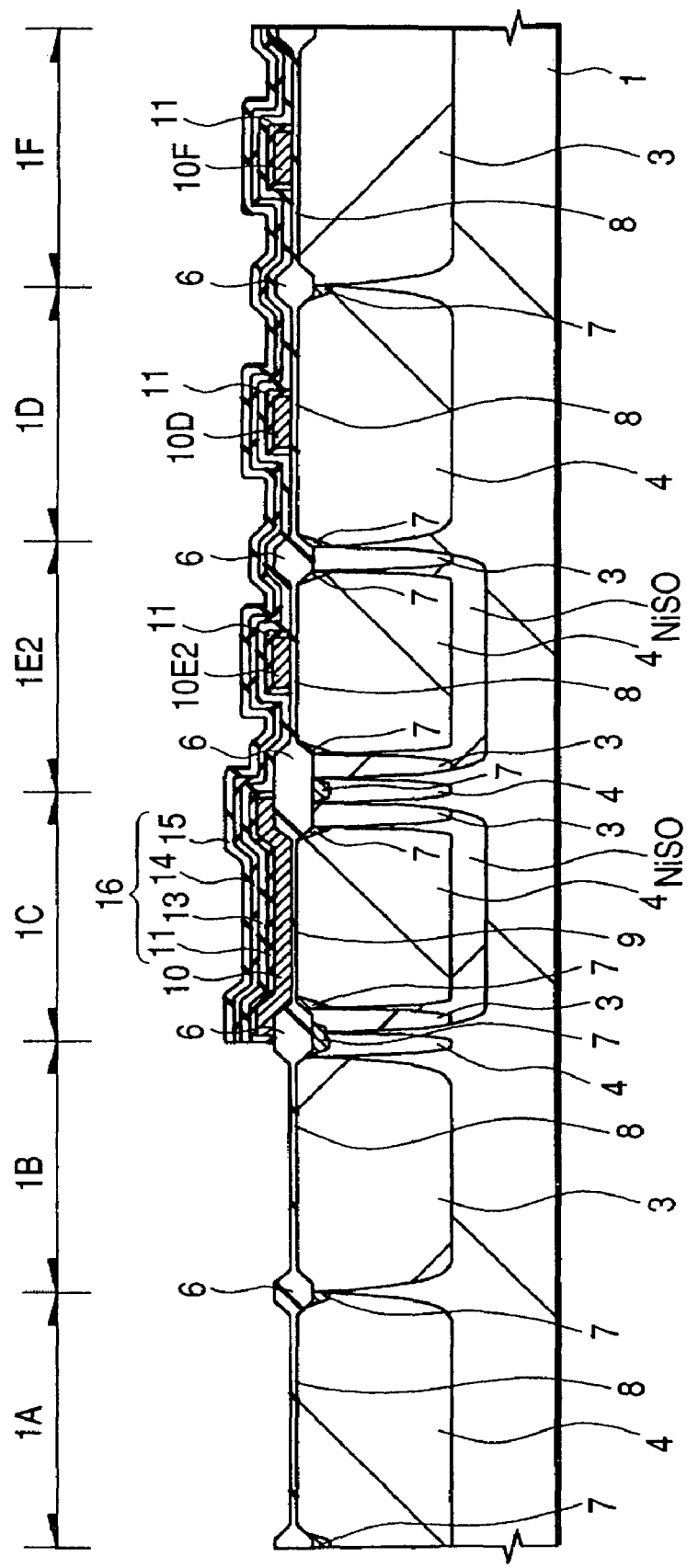
FIG. 33 is a fragmentary cross-sectional view of the semiconductor integrated circuit device during the fabrication step following the step of FIG. 22.

As illustrated in FIG. 33, a silicon nitride film 13, a silicon oxide film 14 and a silicon nitride film 15 are successively stacked over the semiconductor substrate 1. The silicon nitride films 13,15 are formed, for example, by deposition by CVD, while the silicon oxide film 14 is formed, for example, by heat treating the semiconductor substrate 1. The silicon oxide films 11,14 and silicon nitride films 13,15 are called an interlayer capacitor film 16, collectively. Using a photoresist film (not illustrated) patterned by photolithography as a mask, the interlayer capacitor film 16 is dry etched to remove the interlayer capacitor film 16 from the regions 1A,1B.

Over the surface of the p type well 4 in the region 1A and the surface of the n type well 3 in the region 1B, a silicon oxide film (not illustrated) is formed by oxidizing treatment. Then, into the p type well 4 in the region 1A and n type well 3 in the region 1B, $BF_2$ is introduced.

Figure 34:
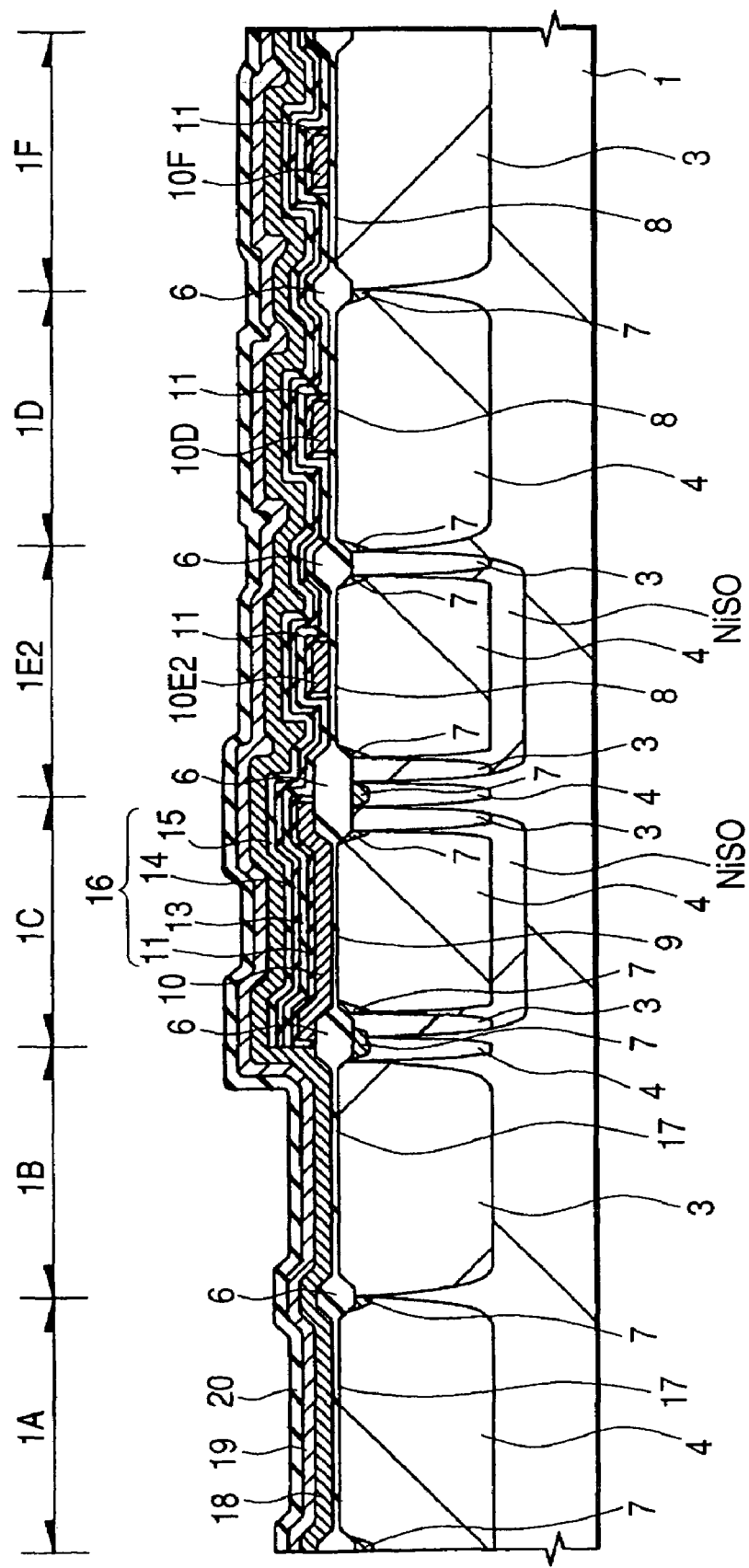
FIG. 34 is a fragmentary cross-sectional view of the semiconductor integrated circuit device during the fabrication step following the step of FIG. 33.

After removal of the photoresist film that is used for dry etching of the interlayer capacitor film 16, the surface of the semiconductor substrate 1 is oxidized to form, for example, a gate insulating film 17 of about 13.5 nm thick over the surface of the p type well 4 in the region 1A and the surface of the n type well 3 in the region 1B, as illustrated in FIG. 34.

Over the main surface of the semiconductor substrate 1, a polycrystalline Si film (second conductive film) 18, $WSi_x$ film (second conductive film) 19 and silicon oxide film 20 are stacked successively. After the deposition of the polycrystalline Si film 18, a phosphate glass film (not illustrated) may be deposited by the coating method, followed by heat treatment of the semiconductor substrate 1 to introduce P into the polycrystalline Si film 18.

Figure 35:
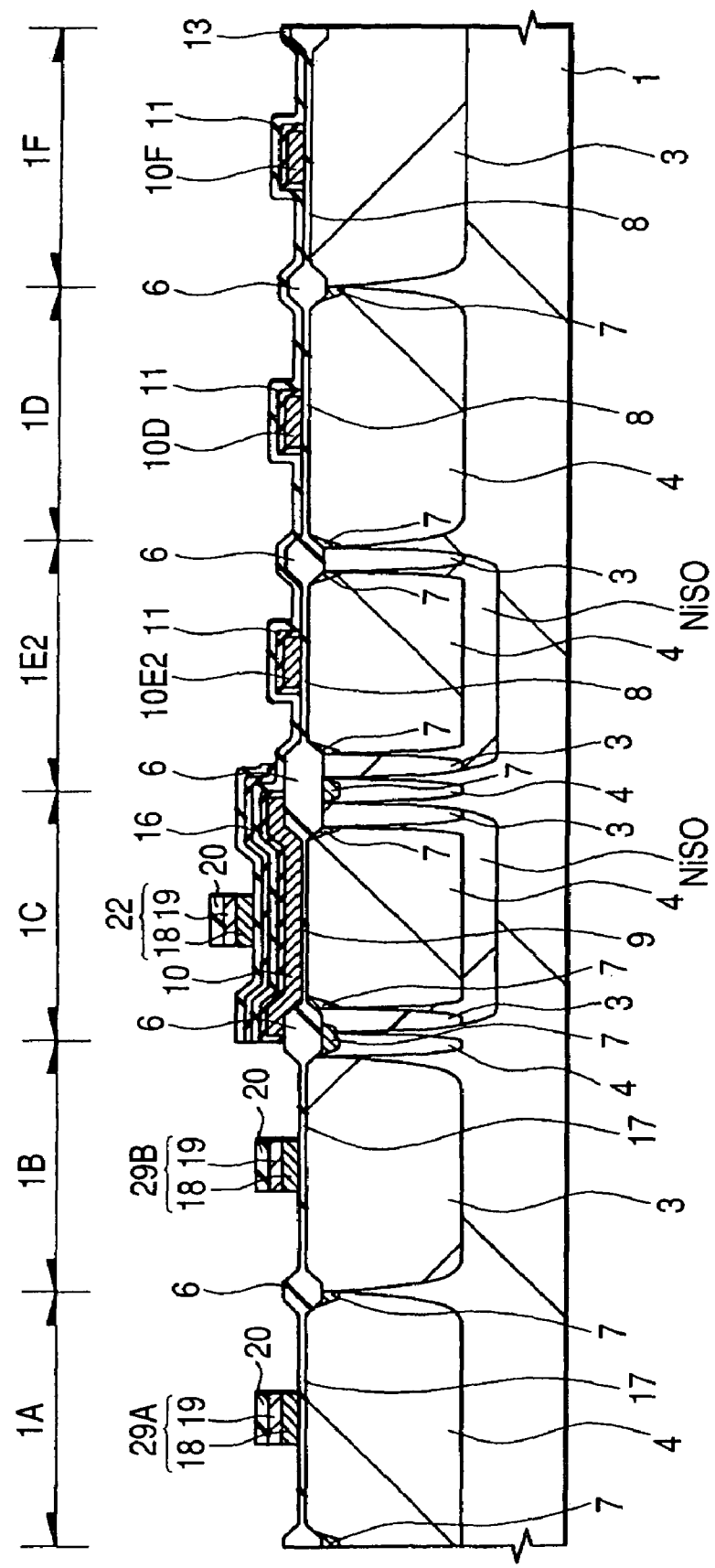
FIG. 35 is a fragmentary cross-sectional view of the semiconductor integrated circuit device during the fabrication step following the step of FIG. 34.

As illustrated in FIG. 35, using a photoresist film (not illustrated) that has been patterned by photolithography as a mask, the silicon oxide film 20 is patterned. After removal of the photoresist film, the $WSi_x$ film 19 and the polycrystalline Si film 18 are dry etched using the silicon oxide film 20 as a mask. By this step, in the regions 1A and 1B, gate electrodes 29A,29B made of the $WSi_x$ film 19 and the polycrystalline Si film 18 can be formed, respectively, while in the region 1C, a control gate electrode 22, that is made of the $WSi_x$ film 19 and the polycrystalline Si film 18, can be formed. In the regions 1E2,1D,1F, the interlayer capacitor film 16 is etched, while leaving the silicon nitride film 13.

Figure 36:
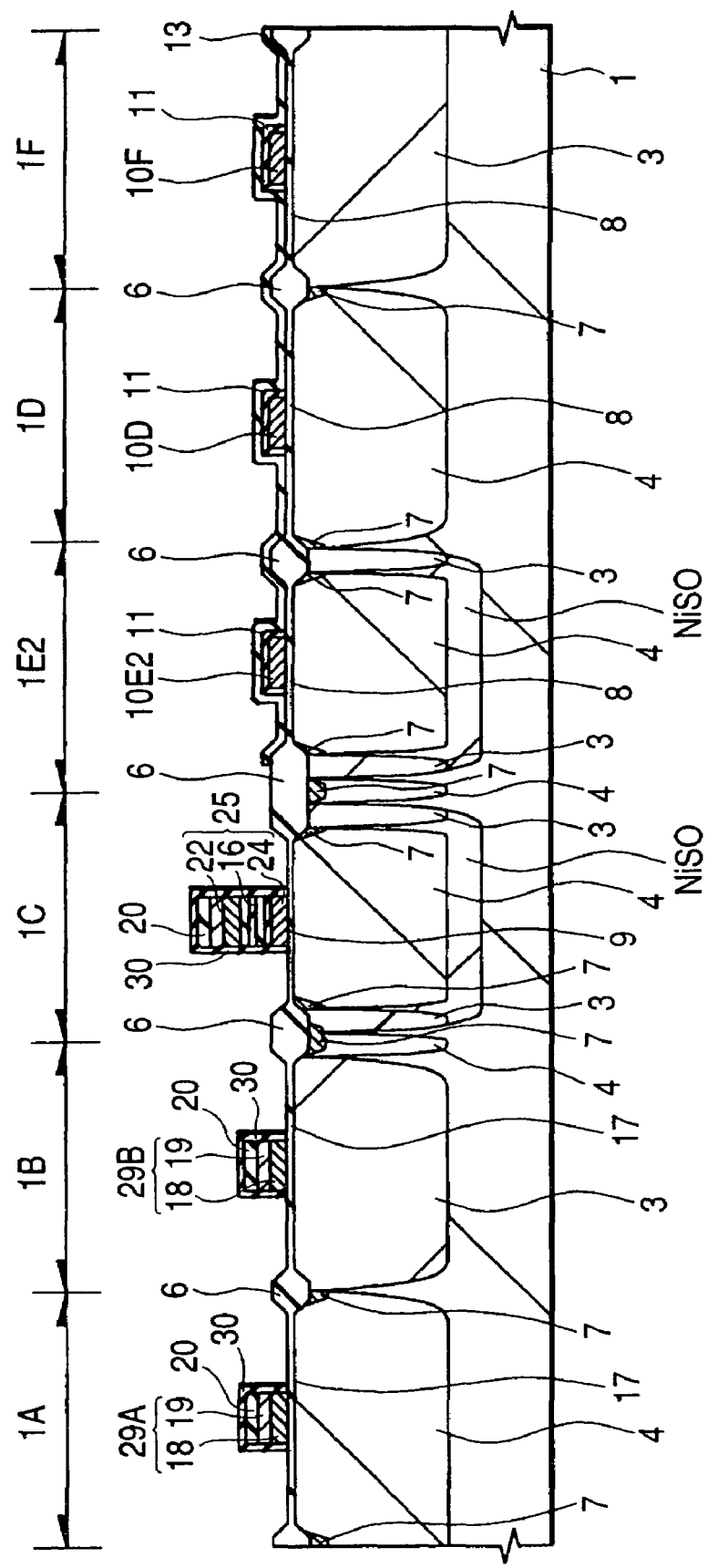
FIG. 36 is a fragmentary cross-sectional view of the semiconductor integrated circuit device during the fabrication step following the step of FIG. 35.

As illustrated in FIG. 36, the polycrystalline Si film 10 is dry etched using the silicon oxide film 20 as a mask in the region 1C, whereby a floating gate electrode 24 can be formed. A region other than the region 1C is covered with the photoresist film so that exposure to the etching atmosphere can be prevented. Here, the floating gate electrode 24, interlayer capacitor film 16 and control gate electrode 22 are called the gate electrode 25, collectively. Oxidizing treatment is then conducted to form a thin silicon oxide film 30 on the side walls and upper surfaces of the gate electrodes 25, 29A and 29B.

Figure 37:
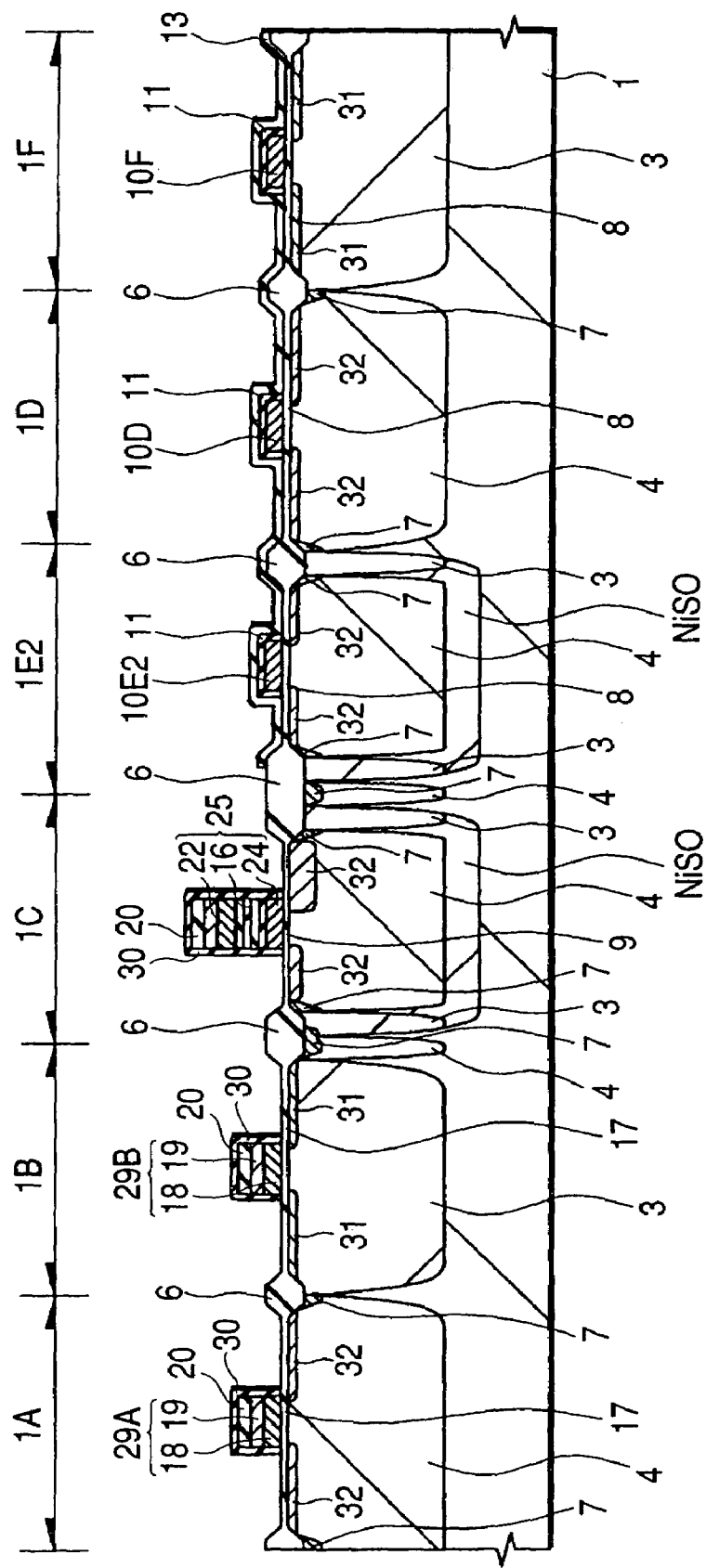
FIG. 37 is a fragmentary cross-sectional view of the semiconductor integrated circuit device during the fabrication step following the step of FIG 36.

As illustrated in FIG. 37, using a photoresist film (not illustrated) that has been patterned by photolithography as a mask, an n type impurity (for example, P) is introduced into the p type well 4 on one side of the gate electrode 25 by ion implantation, followed by heat treatment.

After removal of the photoresist film, a new photoresist film (not illustrated) is formed over the regions 1A, 1C, 1E2 and 1D. Using this photoresist film as a mask, a p type impurity (for example, $BF_2$) is introduced into the n type well 3 by ion implantation, whereby a p⁻ type semiconductor region 31 is formed.

After removal of the photoresist film from the regions 1A, 1C, 1E2 and 1D, another photoresist film (not illustrated) is formed over the regions 1B and 1F. Using the photoresist film as a mask, an n type impurity (for example, P) is introduced into the p type well 4 by ion implantation to form an n⁻ type semiconductor region 32. Then, the photoresist film is removed from the regions 1B and 1F.

Figure 38:
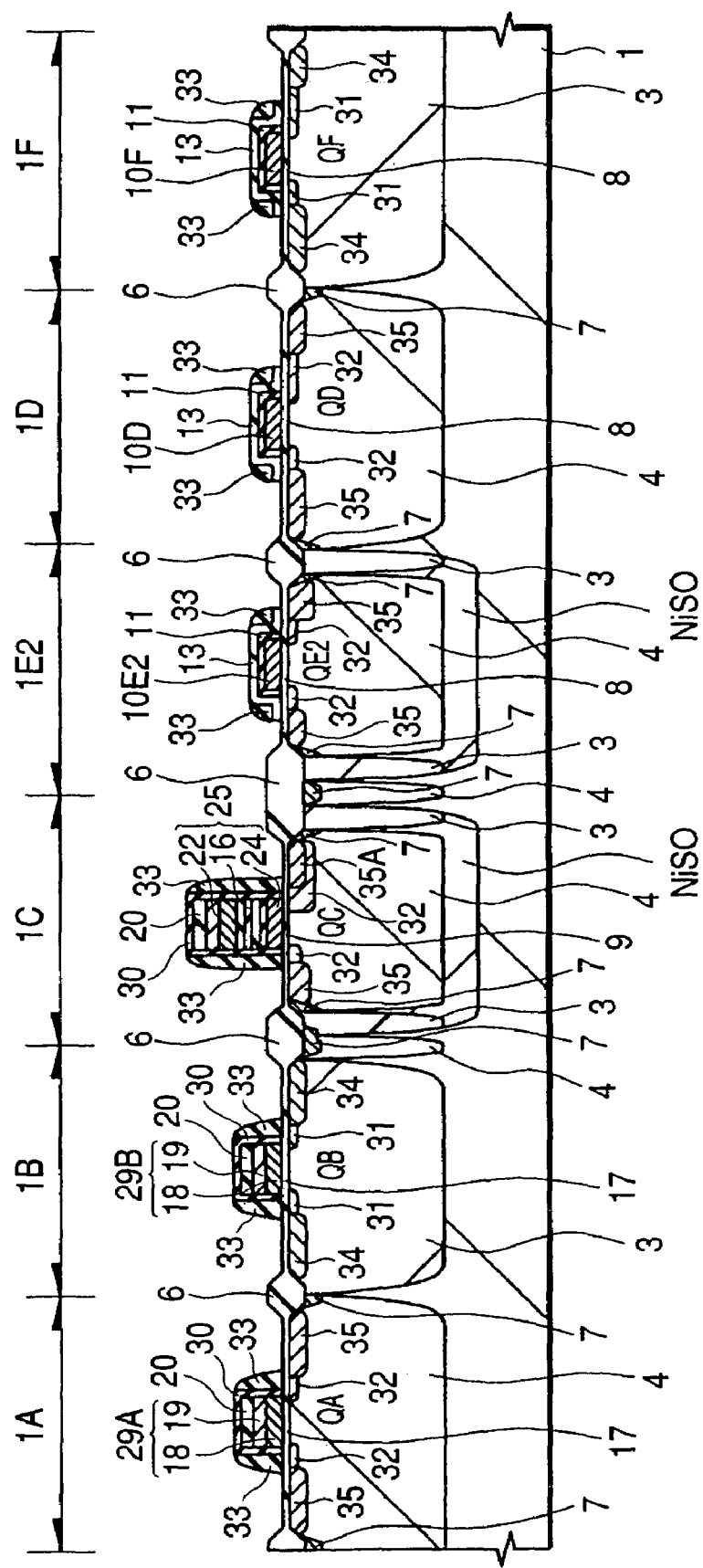
FIG. 38 is a fragmentary cross-sectional view of the semiconductor integrated circuit device during the fabrication step following the step of FIG. 39.

As illustrated in FIG. 38, a silicon oxide film is then deposited over the semiconductor substrate 1 by CVD. By anisotropic etching of the silicon oxide film, side wall spacers 33 are formed by leaving the silicon oxide film on the side walls of the gate electrodes 29A, 29B, 25, 10E2, 10D and 10F.

A photoresist film (not illustrated) is then formed over the regions 1B and 1F and over the gate electrodes 29A, 25, 10E2 and 10D, so as to cover, with the photoresist film, a predetermined range of the n⁻ type semiconductor region 32 on one side of the gate electrode 10D. Using the photoresist film as a mask, an n type impurity (for example, P) is then introduced into the p type well 4 by ion implantation.

After removal of the photoresist film, another photoresist film (not illustrated) is formed over the regions 1A, 1C, 1E2 and 1D and over the gate electrodes 29B and 10F, so as to cover, with the photoresist film, a predetermined range of the p⁻ type semiconductor region 31 on one side of the gate electrode 10D. Using the photoresist film as a mask, a p type impurity (for example, $BF_2$) is then introduced into the n type well 3 by ion implantation. After removal of the photoresist film, the semiconductor substrate 1 is heat treated at about 900° C., whereby a p⁺ type semiconductor region 34 and n⁺ type semiconductor regions 35 and 35A are formed. By these steps, a 5V type nMISQA, a 5V type pMISQB, a MISQC which will constitute a memory cell of a flash memory, a high-breakdown-voltage loading nMISQE2, a high-breakdown-voltage one-side offset nMISQD and a high-breakdown-voltage one-side offset pMISQF can be formed in the regions 1A, 1B, 1C, 1E2, 1D and 1F, respectively.

Figure 39:
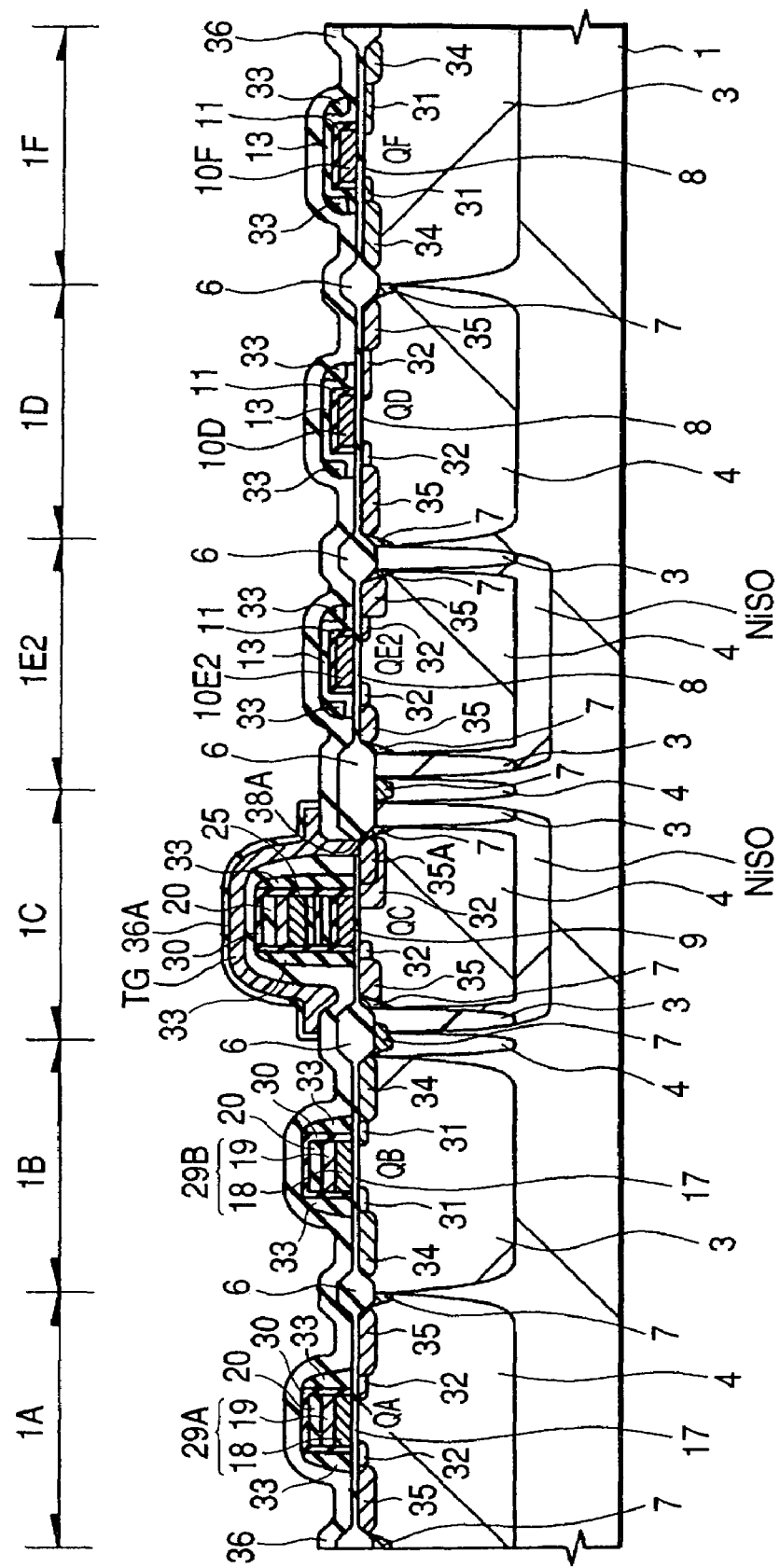
FIG. 39 is a fragmentary cross-sectional view of the semiconductor integrated circuit device during the fabrication step following the step of FIG. 38.

As illustrated in FIG. 39, a silicon oxide film 36 of about 150 nm thick is then deposited over the semiconductor substrate 1 by CVD. The silicon oxide film 36 is then dry etched using a photoresist film (not illustrated) that has been patterned by photolithography as a mask, whereby a contact hole 38A reaching the n⁺ type semiconductor region 35A is formed in the silicon oxide film 36.

After removal of the photoresist film, an amorphous Si film is deposited over the semiconductor substrate 1 by CVD, thereby embedding the contact hole 38A with the amorphous Si film. A polycrystalline Si film is then formed by heat treatment of this amorphous Si film. By dry etching using a photoresist film (not illustrated) that has been patterned by photolithography as a mask, the polycrystalline Si film is patterned to form an interconnect TG. The semiconductor substrate 1 is then heat treated, whereby a silicon oxide film 36A is formed over the surface of the interconnect TG.

Figure 40:
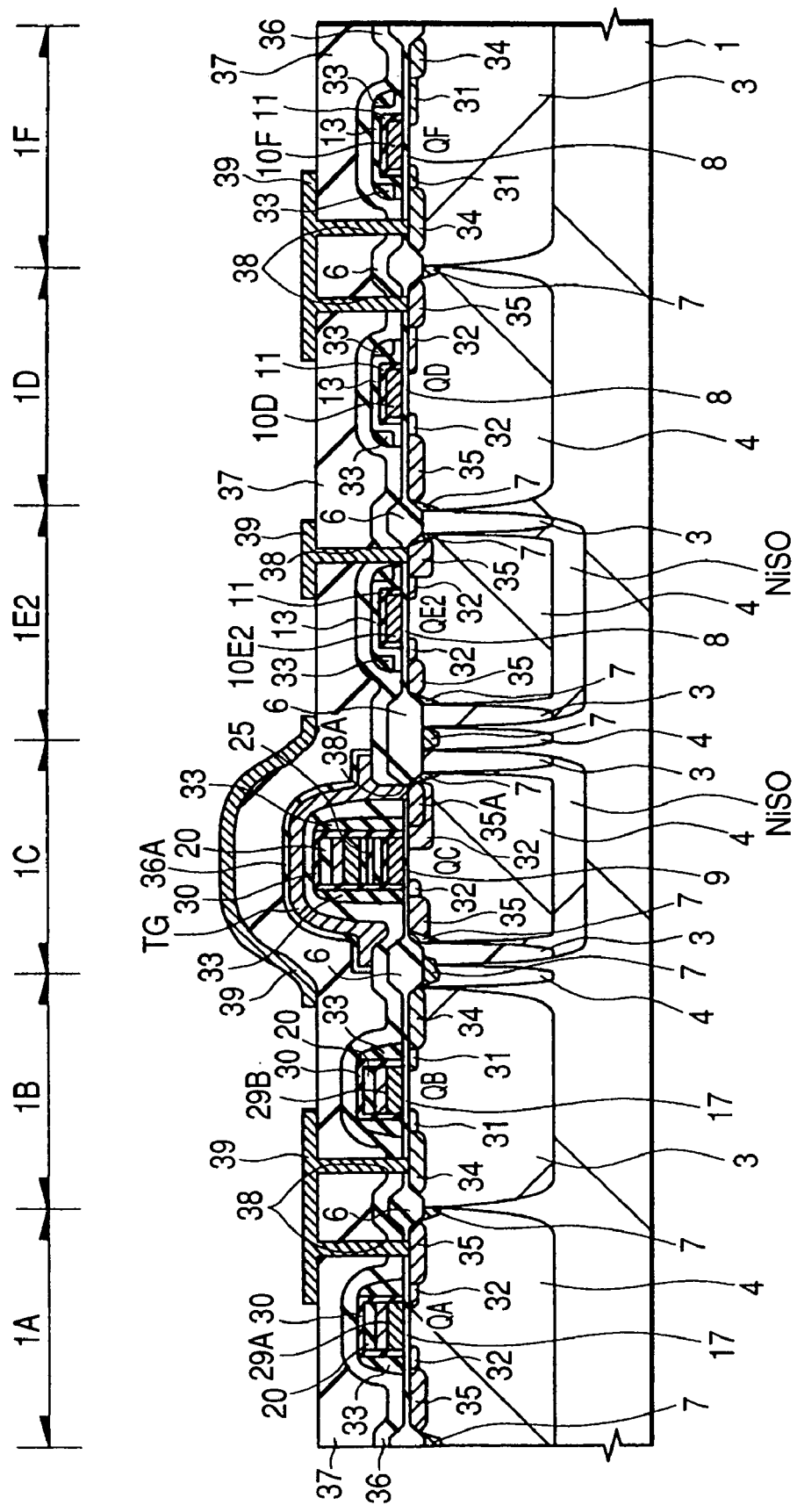
FIG. 40 is a fragmentary cross-sectional view of the semiconductor integrated circuit device during the fabrication step following the step of FIG. 39.

As illustrated in FIG. 40, a BPSG film 37 is deposited over the semiconductor substrate 1 by CVD, followed by heat treatment of the semiconductor substrate at about 900° C. in an $N_2$ atmosphere to planarize the surface of the BPSG film 37.

Through a photoresist film (not illustrated) that has been patterned by photolithography, the BPSG film 37, silicon oxide film 36 and gate insulating films 8,17 are dry etched, whereby a contact hole 38 is formed.

After removal of the photoresist film used for perforation of the contact hole 38, an MoSi (molybdenum silicide) film of about 30 nm thick is deposited in the contact hole 38 and over the BPSG film by sputtering to form a barrier conductor film. Over the barrier conductor film, a metal film to embed therewith the contact hole 38 is deposited by sputtering. This metal film is composed mainly of Al (aluminum) and contains Cu (copper). An antireflective film is then formed by depositing an MoSi film over the metal film. The barrier conductor film has a function of preventing diffusion of the Al in the metal film into the BPSG film 37 and silicon oxide film 36, while the antireflective film serves to prevent irregular reflection upon formation of a photoresist film over the antireflective film in the subsequent step.

By dry etching through a photoresist film (not illustrated) that has been patterned by photolithography, the antireflective film, metal film and barrier conductor film are patterned to form an interconnect 39, whereby the flash memory of this Embodiment is fabricated.

The present invention so far has been described specifically based on embodiments of the invention. It is needless to say that the present invention is not limited to the embodiments, but can be modified to an extent not departing from the gist of the invention.

For example, use of ultrapure water prepared in the above-described embodiment for a cleaning step of a semiconductor substrate during fabrication of a flash memory was described, but it can be applied to a cleaning step employed during the fabrication of a semiconductor integrated circuit device (for example, logic circuit), other than a flash memory.

Of the features of the inventions disclosed by the present application, effects available by representative ones will be described simply below.

It is possible to prevent run-off of ionized amine into the ultrapure water in the step of preparing ultra pure water to be used for the fabrication of a semiconductor integrated circuit device, making it possible to prevent a lowering of the breakdown voltage of a gate insulating film, which will otherwise occur due to the formation of unevenness at the interface between the gate insulating film and the semiconductor substrate.

What is claimed is:

1. A method of fabrication of a semiconductor integrated circuit device, comprising the steps of:
   (a) introducing water into a primary pure water purifying system as first raw material water;
   (b) introducing, as second raw material water, primary pure water which has been obtained by the purification of said first raw material water through use of said primary pure water purifying system, into a secondary pure water purifying system having a secondary pure water circulating loop; and
   (c) feeding a first wet treatment apparatus with secondary pure water which has been obtained by the purification of said second raw material water through use of said secondary pure water purifying system, thereby subjecting a semiconductor integrated circuit wafer to first wet treatment in the first wet treatment apparatus, step (c) including the sub-steps of:
   (c1) removing ions from the second raw material water through use of a cation removing filter disposed between a secondary pure water supply point from the secondary pure water circulating loop and a use point in the first wet treatment apparatus, the cation removing filter having a membrane sheet; and
   (c2) feeding the use point of said first wet treatment apparatus with the secondary pure water which has passed through said cation removing filter.

2. A fabrication method according to claim 1, wherein an ultrafiltration filter is disposed in said secondary pure water circulating loop before the supply point.

3. A fabrication method according to claim 2, wherein said ultrafiltration filter is a heat-welded type.

4. A fabrication method according to claim 2, wherein said first wet treatment is a cleaning treatment.

5. A fabrication method according to claim 4, wherein said semiconductor integrated circuit device comprises a flash memory portion.

6. A fabrication method according to claim 5, wherein said semiconductor integrated circuit device has an MISFET whose gate insulating film or a tunnel oxide film has a thickness, in terms of a silicon oxide film, of 20 nm or less.

7. A fabrication method according to claim 5, wherein said semiconductor integrated circuit device has an MISFET whose gate insulating film or a tunnel oxide film has a thickness, in terms of a silicon oxide film, of 10 nm or less.

8. A fabrication method according to claim 5, wherein said semiconductor integrated circuit device has an MISFET whose gate insulating film or tunnel oxide film has a thickness, in terms of a silicon oxide film, of 5 nm or less.

9. A fabrication method according to claim 4, wherein said semiconductor integrated circuit device has an MISFET whose gate insulating film or a tunnel oxide film has a thickness, in terms of a silicon oxide film, of 5 nm or less.

10. A fabrication method according to claim 1, wherein said cation removing filter is capable of removing ionized amine.

11. A fabrication method according to claim 1, wherein said wet treatment is a rinsing treatment.

12. A fabrication method according to claim 1, wherein said secondary pure water purifying system includes an ultra filter, the cation removing filter being disposed between the ultra filter and the use point such that said ions are removed from the second raw material water through use of said cation removing filter downstream of the ultra filter.

13. A method of wet treating a semiconductor integrated circuit device, forming part of a method of fabrication of said semiconductor integrated circuit device, comprising:
  (a) introducing water into a primary pure water purifying system as first raw material water;
  (b) introducing, as second raw material water, primary pure water which has been obtained by the purification of said first raw material water through use of said primary pure water purifying system, into a secondary pure water purifying system having a secondary pure water circulating loop; and
  (c) feeding a first wet treatment apparatus with secondary pure water which has been obtained by the purification of said second raw material water through use of said secondary pure water purifying system, thereby subjecting a semiconductor integrated circuit wafer to first wet treatment in the first wet treatment apparatus,
  step (c) including the sub-steps of:
  (c1) removing ions from the second raw material water through use of a cation removing filter disposed between a secondary pure water supply point from the secondary pure water circulating loop and a use point in the first wet treatment apparatus, the cation removing filter having a membrane sheet; and
  (c2) feeding the use point of said first wet treatment apparatus with the secondary pure water which has passed through said cation removing filter.

14. The wet-treating method according to claim 13, wherein said wet-treating method is a method of cleaning the semiconductor integrated circuit device.

15. The wet-treating method according to claim 13, wherein said wet-treating method is a method of rinsing the semiconductor integrated circuit device.

16. The wet-treating method according to claim 13, wherein said cation removing filter is capable of removing ionized amine.

17. The wet-treating method according to claim 13, wherein said secondary pure water purifying system includes an ultra filter, the cation removing filter being disposed between the ultra filter and the use point such that said ions are removed from the second raw material water through use of said cation removing filter downstream of the ultra filter.

18. A method of fabrication of a semiconductor integrated circuit device, comprising the steps of:
  (a) introducing first water into a first water purifying system, and sending out first purified water from the first water purifying system;
  (b) introducing the first purified water into a second water purifying system having a pure water circulating loop, and sending out second purified water from a first supply point on the pure water circulating loop; and
  (c) feeding a first wet treatment apparatus with the second purified water, thereby carrying out first wet treatment to a wafer in the first wet treatment apparatus,
  step (c) including the sub-steps of:
  (c1) removing ions from the second purified water through use of an ion removing filter at least capable of removing cations disposed between the first supply point and a use point in the first wet treatment apparatus, the cation removing filter having a membrane sheet; and
  (c2) feeding the use point with the second purified water which has passed through said ion removing filter 19. A fabrication method according to claim 18, wherein an ultrafiltration filter is disposed in said pure water circulating loop before the first supply point.

20. A fabrication method according to claim 19, wherein said ultrafiltration filter is a heat-welded type.

21. A fabrication method according to claim 19, wherein said first wet treatment is a cleaning treatment.

22. A fabrication method according to claim 21, wherein said semiconductor integrated circuit device comprises a flash memory portion.

23. A fabrication method according to claim 22, wherein said semiconductor integrated circuit device has an MISFET whose gate insulating film or a tunnel oxide film has a thickness, in terms of a silicon oxide film, of 20 nm or less.

24. A fabrication method according to claim 22, wherein said semiconductor integrated circuit device has an MISFET whose gate insulating film or a tunnel oxide film has a thickness, in terms of a silicon oxide film, of 10 nm or less.

25. A fabrication method according to claim 22, wherein said semiconductor integrated circuit device has an MISFET whose gate insulating film or tunnel oxide film has a thickness, in terms of a silicon oxide film, of 5 nm or less.

26. A fabrication method according to claim 21, wherein said semiconductor integrated circuit device has an MISFET whose gate insulating film or a tunnel oxide film has a thickness, in terms of a silicon oxide film, of 5 nm or less.

27. A fabrication method according to claim 18, wherein said ion removing filter is capable of removing ionized amine.

28. A fabrication method according to claim 18, wherein said wet treatment is a rinsing treatment.

* * * * *